US012757472B2

(12) United States Patent
Yang et al.

(10) Patent No.: US 12,757,472 B2
(45) Date of Patent: Oct. 6, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Jeeeun Yang, Suwon-si (KR); Sangwook Kim, Suwon-si (KR); Euntae Kim, Suwon-si (KR); Kwanghee Lee, Suwon-si (KR); Moonil Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 263 days.

(21) Appl. No.: 18/481,444

(22) Filed: Oct. 5, 2023

(65) Prior Publication Data

US 2024/0120403 A1 Apr. 11, 2024

(30) Foreign Application Priority Data

Oct. 7, 2022 (KR) ........................ 10-2022-0129049
Sep. 27, 2023 (KR) ........................ 10-2023-0131156

(51) Int. Cl.

| | |
|---|---|
| ***H10D 64/62*** | (2025.01) |
| ***H10D 30/67*** | (2025.01) |
| ***H10D 64/01*** | (2025.01) |
| ***H10D 99/00*** | (2025.01) |
| ***H10P 14/20*** | (2026.01) |
| ***H10P 14/24*** | (2026.01) |

(52) U.S. Cl.

CPC ......... *H10D 64/62* (2025.01); *H10D 30/6728* (2025.01); *H10D 30/6755* (2025.01); *H10D 30/6757* (2025.01); *H10D 64/011* (2026.01); *H10D 99/00* (2025.01); *H10P 14/24* (2026.01); *H10P 14/3434* (2026.01)

(58) Field of Classification Search

None

See application file for complete search history.

(56) References Cited

U.S. PATENT DOCUMENTS

| | | | |
|---|---|---|---|
| 8,410,838 | B2 | 4/2013 | Kato et al. |
| 8,559,220 | B2 | 10/2013 | Yamazaki et al. |
| 8,883,556 | B2 | 11/2014 | Yamazaki |
| 9,177,872 | B2 | 11/2015 | Sandhu |

(Continued)

FOREIGN PATENT DOCUMENTS

| | | | |
|---|---|---|---|
| KR | 10-2142477 | B1 | 8/2020 |
| KR | 10-2025-0000744 | A | 1/2025 |

OTHER PUBLICATIONS

Xinlv Duan et al., "Novel Vertical Channel-All-Around(CAA) IGZO FETs for 2TOC DRAM with High Density beyond 4F2 by Monolithic Stacking", Huawei Technologies, IEEE 10.5.1-10.5.4 IEDM21-222-IEDM21-225 (2021).

*Primary Examiner* — Anthony Ho

(74) *Attorney, Agent, or Firm* — HARNESS, DICKEY & PIERCE, P.L.C.

(57) ABSTRACT

Provided are a semiconductor device and a method of manufacturing the same. The semiconductor device includes a lower electrode on a substrate, a metal oxide on the lower electrode, a buffer on the metal oxide, an oxide channel in the buffer, a gate insulating layer in the oxide channel, a gate electrode in the gate insulating layer, and an upper electrode on the gate electrode, and the buffer may include a silicide material.

15 Claims, 27 Drawing Sheets

(56) References Cited

U.S. PATENT DOCUMENTS

| | | | |
|---|---|---|---|
| 9,431,441 B1 | 8/2016 | Zhou et al. | |
| 9,564,217 B1 | 2/2017 | Zhou et al. | |
| 9,711,549 B2 | 7/2017 | Yamazaki et al. | |
| 9,882,056 B2 | 1/2018 | Lee et al. | |
| 10,192,913 B2 | 1/2019 | Kurokawa | |
| 10,236,033 B2 | 3/2019 | Koyama et al. | |
| 10,347,637 B2 | 7/2019 | Sandhu | |
| 10,522,693 B2 | 12/2019 | Kurokawa | |
| 11,017,843 B2 | 5/2021 | Sharma et al. | |
| 11,335,788 B2 | 5/2022 | Ramaswamy et al. | |
| 2020/0044095 A1 | 2/2020 | Wang et al. | |
| 2020/0091156 A1 | 3/2020 | Sharma et al. | |
| 2020/0227519 A1 | 7/2020 | Song et al. | |
| 2021/0367080 A1 | 11/2021 | Lee et al. | |
| 2024/0120421 A1* | 4/2024 | Yang | H10D 30/6755 |
| 2025/0006844 A1 | 1/2025 | Yang et al. | |

* cited by examiner

SEMICONDUCTOR DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0129049, filed on Oct. 7, 2022, and Korean Patent Application No. 10-2023-0131156, filed on Sep. 27, 2023, in the Korean Intellectual Property Office, the disclosures of each of which are incorporated by reference herein in its entirety.

BACKGROUND

Example embodiments relate to a semiconductor device including a buffer and/or a method of manufacturing the semiconductor device.

Transistors are semiconductor devices that serve as electrical switches and are employed in various integrated circuit devices including memory devices, integrated circuit (IC) devices, logic devices, and/or the like. In order to increase the degree of integration of integrated circuit devices, the space occupied by transistors provided therein is rapidly reduced, and research has been conducted to reduce the size of transistors and maintaining or improving the performance of the integrated circuit devices.

One of the important parts in the transistor is a gate electrode. When a voltage such as a threshold voltage is applied to the gate electrode, a channel adjacent to the gate opens a current path, and when a voltage such as the threshold voltage is not applied to the gate electrode, the current path is closed to block a current flow. The performance of semiconductors depends on how much a leakage current is reduced and efficiently managed in gate electrodes and/or in channels. The larger the area in which the gate electrode and the channel that control the current in the transistor contact each other, the higher the power efficiency.

As the semiconductor process becomes smaller, the size of the transistor decreases, and the area where the gate electrode and the channel contact or overlap each other decreases, thereby causing problems due to a short channel effect. For example, phenomena such as one or more of threshold voltage variation, carrier velocity saturation, and deterioration of the subthreshold characteristics occur. Accordingly, a method of overcoming or reducing the impact of the short channel effect and/or effectively reducing the channel length is needed or desired.

SUMMARY

Provided is a semiconductor device including a buffer.

Alternatively or additionally, provided is a method of manufacturing the semiconductor device including a buffer.

Additional aspects will be set forth in part in the description which follows and, in part, will be apparent from the description, or may be learned by practice of the presented embodiments of the disclosure.

According to some example embodiments, a semiconductor device includes a substrate, a lower electrode on the substrate, a metal oxide on or in the lower electrode, a first buffer on or in the metal oxide, an oxide channel on or in the first buffer, a gate insulating layer on, in, contacting, or adjacent to the oxide channel, a gate electrode on, in, contacting, or adjacent to the gate insulating layer, and an upper electrode on the gate electrode or the oxide channel. The first buffer is between the metal oxide and the oxide channel, the first buffer includes a silicide material, the upper electrode and the lower electrode are spaced apart from each other in a direction perpendicular to the substrate, and longitudinal direction of the oxide channel is arranged perpendicularly to the substrate.

The silicide material may include at least one of $WSi_x$ (tungsten silicide), $RuSi_x$ (ruthenium silicide), $NiSi_x$ (nickel silicide), and/or $TiSi_x$ (titanium silicide).

The first buffer may have a thickness of about 1 Angstrom or more and about 50 Angstroms or less.

The semiconductor device may further include a second buffer between the upper electrode and the oxide channel, the second buffer including a silicide material.

The semiconductor device may further include a second buffer between the upper electrode and the oxide channel and including at least one of molybdenum (Mo), gold (Au), platinum (Pt), rhodium (Rh), ruthenium (Ru), titanium (Ti), tantalum (Ta), and iridium (Ir).

The first buffer may directly contact both the metal oxide and the oxide channel.

The gate electrode may surround a perimeter of the oxide channel.

The oxide channel may include at least one of indium (In), zinc (Zn), tin (Sn), gallium (Ga), and hafnium (Hf).

The oxide channel may include In and Zn, and an atomic percent of In in a metal contact part of the oxide channel may be greater than or equal to the content of Zn in the metal contact part of the oxide channel.

The oxide channels may include a material selected from among InGaZnO, ZnO, ZrInZnO, InZnO, $InGaZnO_4$, ZnSnO, ZnInO, $In_2O_3$, $Ga_2O_3$, HfInZnO, GaInZnO, $HfO_2$, $SnO_2$, $WO_3$, $TiO_2$, $Ta_2O^5$, $In_2O_3SnO_2$, MgZnO, $ZnSnO_3$, $ZnSnO_4$, CdZnO, $CuAlO_2$, $CuGaO_2$, $Nb_2O_5$, $TiSrO_3$, zinc indium oxide (ZIO), indium gallium oxide (IGO), and a combination thereof.

The lower electrode may include at least one of tungsten (W), cobalt (Co), nickel (Ni), iron (Fe), titanium (Ti), molybdenum (Mo), chromium (Cr), zirconium (Zr), hafnium (Hf), niobium (Nb), tantalum (Ta), silver (Ag), gold (Au), aluminum (Al), copper (Cu), antimony (Sb), vanadium (V), ruthenium (Ru), platinum (Pt), zinc (Zn), and magnesium (Mg).

The longitudinal direction of each of the oxide channel, the gate insulating layer, and the gate electrode may be arranged to be oriented in a direction perpendicular to the substrate, and each of the oxide channel, the gate insulating layer, and the gate electrode may be arranged in a horizontal direction with respect to the substrate.

The oxide channel may have a U-shaped cross-section.

The oxide channel may include a first oxide channel having an L shape in which the longitudinal direction of the oxide channel is arranged to be oriented in a direction perpendicular to the substrate, and a second oxide channel symmetrically arranged with respect to the first oxide channel in the perpendicular direction. The gate electrode may include a first gate electrode having a longitudinal direction arranged to be oriented in a direction perpendicular to the substrate and a second gate electrode that is symmetrically arranged with respect to the first gate electrode in the perpendicular direction.

The lower electrode, the metal oxide, the first buffer, and the oxide channel may have the same width.

According to various example embodiments, a method of manufacturing a semiconductor device includes providing a lower electrode on a substrate, depositing a first buffer on the lower electrode, depositing an oxide channel on the first buffer, depositing a gate insulating layer on or to contact the oxide channel, depositing a gate electrode on the gate insulating layer, and depositing an upper electrode on the oxide channel. The first buffer is between the lower electrode and the oxide channel, the buffer includes a silicide material, the upper electrode and the lower electrode are spaced apart from each other in a direction perpendicular to the substrate, and the longitudinal direction of the oxide channel may be arranged perpendicularly to the substrate.

The depositing of the first buffer on the lower electrode may include depositing a metal-silicon composite layer on the lower electrode, and forming the buffer by heat-treating the metal-silicon composite layer.

The silicide material may include at least one of $WSi_x$, $RuSi_x$, $NiSi_x$, and/or $TiSi_x$.

The depositing of an upper electrode on the oxide channel may include further depositing, on the oxide channel, a second buffer including a material with an oxidation reactivity less than that of the upper electrode, and depositing the upper electrode on the second buffer that includes the material with the oxidation reactivity less than that of the upper electrode.

The oxide channel may include In and Zn, and atomic percentage of In in a metal contact part of the oxide channel may be greater than or equal to atomic percentage of Zn in the metal contact part of the oxide channel.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
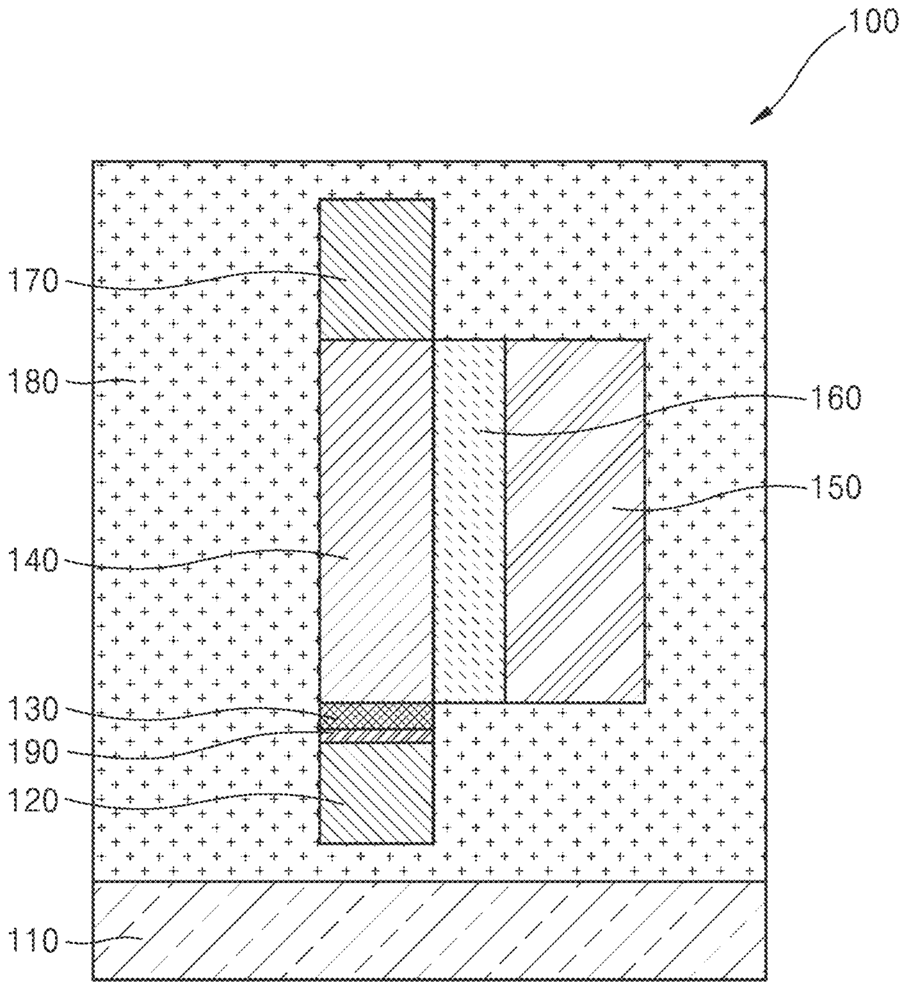
FIG. 1 is a diagram illustrating a semiconductor device including a buffer according to various example embodiments.

Reference will now be made in detail to various embodiments, examples of which are illustrated in the accompanying drawings, wherein like reference numerals refer to like elements throughout. In this regard, various embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a semiconductor device including a buffer according to various example embodiments and a manufacturing method thereof will be described in detail with reference to the accompanying drawings. In the following drawings, the same reference numerals refer to the same components, and the size of each component in the drawings may be exaggerated for clarity and convenience of description. The terms first, second, etc. may be used to describe various components, but the components should not be limited by terms. The terms are used only for the purpose of distinguishing one component from other components.

Singular expressions include plural expressions unless the context clearly means otherwise. In addition, when a part "contains" a component, this means that it may contain other components, rather than excluding other components, unless otherwise stated.

The use of the term "the" and similar indicative terms may correspond to both singular and plural.

Steps constituting the method may be performed in an appropriate order unless there is a clear statement that the steps should be performed in the order described. In addition, the use of all illustrative terms (e.g., etc.) is simply intended to detail technical ideas and, unless limited by the claims, the scope of rights is not limited due to the terms.

Recently, Si-based memory or logic devices have reached or may have reached the limit of high integration, and require or use a channel length of several tens or several nanometers, making it very important to reduce off-current. In addition, it may be possible to improve a subthreshold swing (SS) and/or an on/off current ratio and the like as the characteristics required to clearly distinguish an on/off state. Oxide semiconductor transistors used as large-area display driving devices may have very good characteristics (e.g., low off-current, low SS, and/or high on/off current ratio). Accordingly, a method of utilizing an oxide semiconductor device having such an advantage as a memory and/or logic device, and/or increasing the degree of integration has been recently proposed.

However, due to the short-channel effect caused by scaling down, it may be difficult to immediately apply the display driving device to the semiconductor-oriented device, and performance may vary. Typically, the size (e.g., a width such as a transistor width and/or length such as a transistor length) of the channel layer may be reduced to make it difficult to control the threshold voltage, and/or a contact area in which the channel meets the electrode may be reduced to increase a contact resistance.

In particular, when atomic layer deposition (ALD) technology is applied to deposit an oxide semiconductor on an electrode to a channel length of several tens of nanometers or less, the oxide semiconductor is deposited at a temperature higher than room temperature such as used in the ALD method. Therefore, contact resistance may increase due to a side reaction between a metal of the electrode and a reactant.

Table 1 below shows a comparison between the case of deposition by a sputtering method and the case of deposition by an ALD method.

TABLE 1

| | SD | Gox | Vth, sat (V) | Ion (uA/um) | SS (mV/dec) |
|---|---|---|---|---|---|
| Sputter-IGZO | W | HfO | −0.24 | 3.372 | 90 |
| ALD-IGZO | 20 nm<br>Etch#6<br>20 s | 10 nm | −1.94 | 0.333 | 95 |

Referring to Table 1 above, it may be seen that when an oxide channel is deposited by the ALD method, a saturation threshold voltage of $V_{th,sat}$ and an Ion value are decreased and an SS value is increased, compared to when the oxide channel is deposited by a sputtering/physical vapor deposition method.

In various example embodiments, a (first) buffer may be inserted into a partial and/or the entire contact region where the oxide semiconductor and the electrode are in contact, and side reactions of electrodes occurring during the ALD process of the oxide semiconductor can be suppressed/improved, and device characteristics can be improved. The buffer may include a metal material or a silicide material having an oxidation reactivity less than that of the electrode material.

The buffer may include a metal-based material (e.g., TiN, molybdenum (Mo), gold (Au), platinum (Pt), rhodium (Rh), ruthenium (Ru), titanium (Ti), tantalum (Ta), and/or iridium (Ir)) that are less reactive with oxygen than the electrode material. The buffer may include a metal material having high reactivity with oxygen when the by-product formed during the oxidation reaction is a material having low resistance.

Alternatively or additionally, the buffer may include a silicide material (e.g., $WSi_x$ (tungsten silicide), $RuSi_x$ (ruthenium silicide), $NiSi_x$ (nickel silicide), and/or $TiSi_x$ (titanium silicide). A silicide material, and/or a conductive oxide such as indium tin oxide (ITO) may be included only at an interface part of the electrode.

The buffer may include a plurality of materials. For example, the buffer may include a multilayer structure of a silicide material and a metal-based material having lower reactivity with oxygen than an electrode material.

In a 3D structured semiconductor device (e.g., a vertical channel transistor (VCT) using an oxide semiconductor material as a channel, contact resistance may be lowered, and an oxide semiconductor material with a desired composition may be manufactured, by introducing a buffer capable of suppressing byproduct generation in a contact area where an oxide semiconductor and an electrode are in contact.

FIG. 1 is a diagram illustrating a semiconductor device including a buffer according to various example embodiments.

Referring to FIG. 1, the semiconductor device 100 may include a substrate 110, a lower electrode 120, a buffer 130, an oxide channel 140, a gate electrode 150, a gate insulating layer 160, an upper electrode 170, and/or a mold insulator 180.

The substrate 110 may be or may have a flat plate shape provided on a plane. A vertical direction (a Z direction) may be a direction perpendicular to the substrate 110. As an example, the substrate 110 may include a conductive substrate. The substrate 110 may be or may include an insulating substrate or a semiconductor substrate having an insulating layer formed on a surface thereof.

The lower electrode 120 may be arranged above the substrate 110. The lower electrode 120 may be positioned above the substrate 110 and below the oxide channel 140. The lower electrode 120 may be positioned in the vertical direction Z with respect to the substrate 110. The oxide channel 140 may function as a channel layer, e.g. as a channel layer of a transistor. The lower electrode 120 may include a metal material. The lower electrode 120 may include at least one selected from the group consisting of or including tungsten (W), cobalt (Co), nickel (Ni), iron (Fe), titanium (Ti), molybdenum (Mo), chromium (Cr), zirconium (Zr), hafnium (Hf), niobium (Nb), tantalum (Ta), silver (Ag), gold (Au), aluminum (Al), copper (Cu), antimony (Sb), vanadium (V), ruthenium (Ru), platinum (Pt), zinc (Zn), and magnesium (Mg). The lower electrode 120 may be in contact with, or in direct contact with the substrate 110, but may be electrically connected to the substrate 110 even if it is not in contact with the substrate 110.

The oxide channel 140 may be deposited in an ALD manner. The oxide channel 140 may be deposited in a plasma enhanced-atomic layer deposition (PE-ALD) manner. The oxide channel 140 may be selected from the group consisting of or including InGaZnO, ZnO, ZrInZnO, InZnO, $InGaZnO_4$, ZnInO, ZnSnO, $In_2O_3$, $Ga_2O_3$, HfInZnO, GaInZnO, $HfO_2$, $SnO_2$, $WO_3$, $TiO_2$, $Ta_2O^5$, $In_2O_3SnO_2$, MgZnO, $ZnSnO_3$, $ZnSnO_4$, CdZnO, $CuAlO_2$, $CuGaO_2$, $Nb_2O_5$, $TiSrO_3$, zinc indium oxide (ZIO), indium gallium oxide (IGO), and a combination thereof. Alternatively or additionally, the oxide channel 140 may function as a channel layer and may have a band gap of 3.0 electron-volts (ev) or more.

As the ALD method is performed at a higher temperature than a sputtering process and uses a material having a high reactivity as a deposition material, other layers may be affected during the deposition of a target layer. For example, when forming the oxide channel 140 on the lower electrode 120 through the ALD method, the oxygen source of the oxide channel 140 may react to the lower electrode 120 adjacent thereto, and the interfacial resistance may increase.

The semiconductor device 100 according to an embodiment may include the buffer 130 between the lower electrode 120 and the oxide channel 140 to improve performance of the semiconductor device. For example, the buffer 130 may include silicide material or metal having lower reactivity with oxygen than an electrode material to oxygen, and the oxygen source may not pass through the buffer 130. Accordingly, the reaction between the lower electrode 120 and the oxygen source may be substantially prevented during the process of forming the oxide channel 140.

A metal oxide 190 may be arranged on the lower electrode 120. A metal included in the metal oxide 190 may be identical to a metal included in the lower electrode 120. For example, the metal oxide 190 may include at least one of W, Co, Ni, Fe, Ti, Mo, Cr, Zr, Hf, Nb, Ta, Ag, Au, Al, Cu, Sb, V, Ru, Pt, An, and Mg.

The metal oxide 190 may be formed by reacting a metal source on or in the lower electrode 120 or oxidizing a metal of the lower electrode 120 by heat treatment, etc. in the process of forming the oxide channel 140. The vertical direction (z-direction) level of the upper of the metal oxide 190 may be substantially equal to the vertical direction (z-direction) level of the upper surface of the lower electrode 120. The content of oxygen included in the metal oxide 190 may be changed towards an oxide channel 140 from the lower electrode 120. For example, the content of oxygen included in the metal oxide 190 may decrease as a distance to oxide channel 140 increases. An interface between the lower electrode 120 and the metal oxide 190 may be unclear. For example, the metal oxide 190 may be formed as a part of the lower electrode 120. The metal oxide 190 may be formed discontinuously or continuously on the lower electrode 120.

Figure 5:
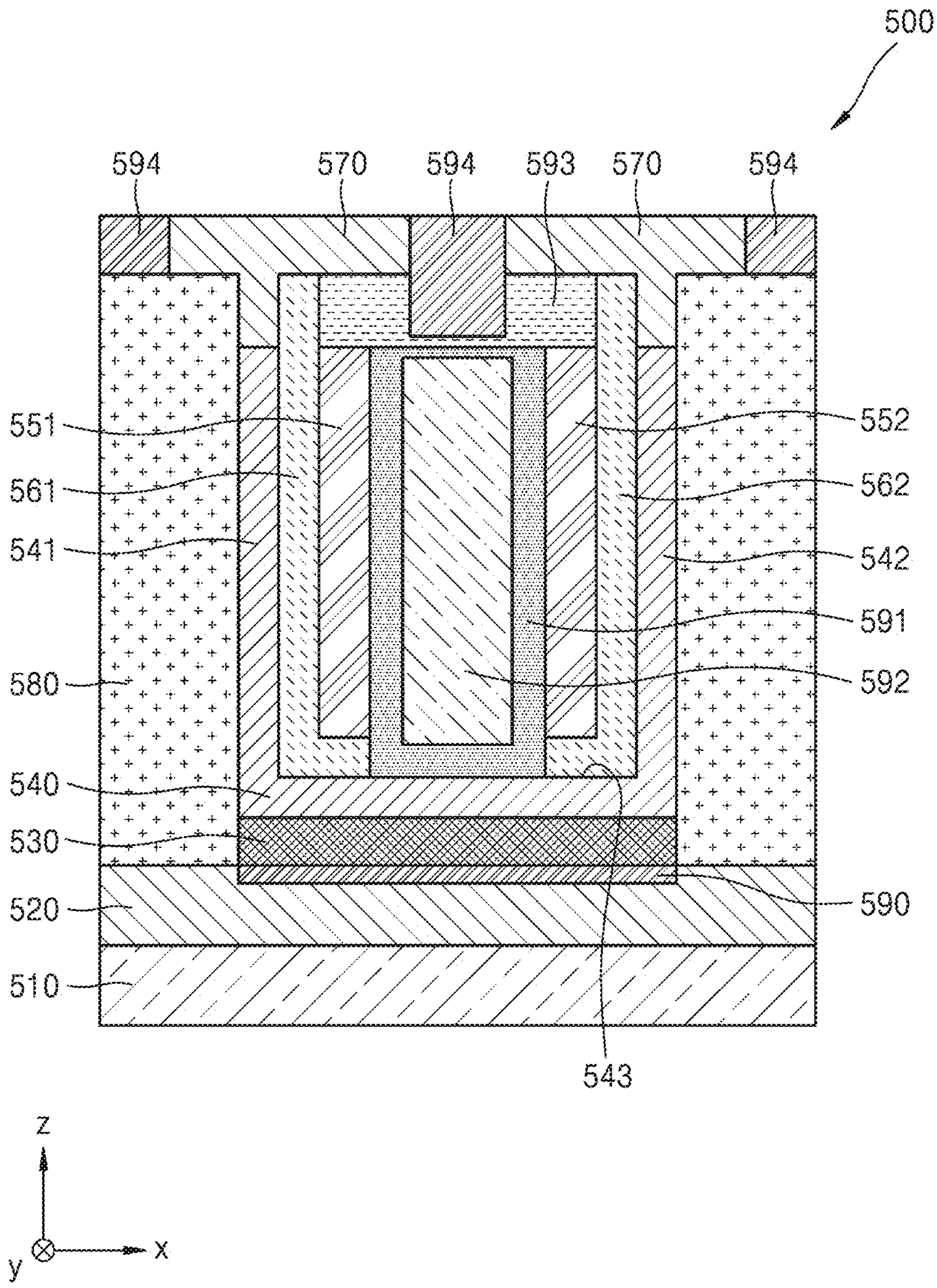
FIG. 5 is a diagram illustrating a semiconductor device including a buffer according to various example embodiments.

The buffer 130 may be positioned on the upper surface of the metal oxide 190. The buffer 130 may be positioned in the vertical direction z of the metal oxide 190. The oxide channel 140 may cover the entire upper surface of the buffer 130. The width of the oxide channel 140 (for example, the width in the x-axis direction as shown in FIG. 5) may be the same as the width of the buffer 130 or the metal oxide 190. The oxide channel 140 may extended in a direction in which the substrate 110, the lower electrode 120, the metal oxide 190, and the buffer 130 are sequentially stacked.

The buffer 130 may include a silicide material (e.g., $WSi_x$, $RuSi_x$, $NiSi_x$, or $TiSi_x$). Here, x may represent a number greater than 1 and less than 3. Alternatively or additionally, the buffer 130 may include a metal (e.g., Mo, Au, Pt, Rh, Ru, Ti, Ta, or Ir) that has a lower oxidation reactivity than the lower electrode 120. In some example embodiments, the thickness of the buffer 130 may be about 1 Angstrom to about 50 Angstroms. The buffer 130 may cover all or at least a part of the upper surface of the lower electrode 120. Here, the lower electrode 120 may be formed as or correspond to a bit line, and the buffer 130 may be provided along the lower electrode 120. Alternatively or additionally, for example, the width of the buffer 130 may be the same as the width of the lower electrode 120, the metal oxide 190.

The oxide channel 140 may be arranged on, in, or at least partially in or within the buffer 130. The oxide channel 140 may be in contact with the upper surface of the buffer 130. The oxide channel 140 may be located in the vertical direction Z with respect to the buffer 130. The oxide channel 140 may cover the entire upper surface of the buffer 130. For example, the width of the oxide channel 140 may be the same as the width of the buffer 130. The oxide channel 140 may extend in a direction in which the substrate 110, the lower electrode 120, and the buffer 130 are sequentially stacked. The width of the oxide channel 140 may be the same as the width of the lower electrode 120, the metal oxide 190, or the buffer 130.

The semiconductor device 100 according to an embodiment may have a proper thickness ratio among the lower electrode 120, the metal oxide 190, the buffer 130, and the oxide channel 140. As the metal oxide 190 has high resistance characteristics when its thickness is greater than or equal to a certain value, the characteristics of the semiconductor device 100 may be deteriorated. For example, the density of an on current flowing in the lower electrode 120 and the oxide channel 140 may decrease drastically. The thickness of the buffer 130 may control the thickness of the metal oxide 190. For example, the greater the thickness of the buffer 130 is, the thinner the thickness of the metal oxide 190 may be. As a great thickness of the buffer 130 leads to an increased size of the semiconductor device 100, the thickness of the buffer 130 may be up to one time the thickness of the oxide channel 140.

The thickness of the metal oxide 190 may be less than the thickness of the lower electrode 120. The thickness of the metal oxide 190 may be less than or equal to about 25%, less than or equal to about 20%, or less than or equal to about 18% of the thickness of the lower electrode 120, and may be greater than or equal to 1% of the thickness of the lower electrode 120.

The gate electrode 150 may be arranged to be spaced apart from the oxide channel 140. The gate electrode 150 may be arranged to face a part or all of the oxide channel 140. The gate electrode 150 may include an electrically conductive material. For example, the gate electrode 150 may include a metal and/or a metal compound. In this case, the gate insulation layer 160 may be arranged between the oxide channel 140 and the gate electrode 150 to electrically disconnect the oxide channel 140 with the gate electrode 150. The gate insulating layer 160 may include an insulating material. For example, the gate insulating layer 160 may include a dielectric. The width of the gate insulating layer 160 may be the same as the width of the gate electrode 150.

The upper electrode 170 may be arranged on the oxide channel 140. The upper electrode 170 may include a metal material. The upper electrode 170 may be located on the oxide channel 140 in a direction where the lower electrode 120, the metal oxide 190, the buffer 130, and the oxide channel 140 are sequentially stacked. The upper electrode 170 may be positioned in a vertical direction of the oxide channel 140. The lower electrode 120, the metal oxide 190, the buffer 130, the oxide channel 140, and the upper electrode 170 may be stacked in order in a direction perpendicular to the substrate 110 without intervention of other layers.

The mold insulator 180 may fill an empty space so that the lower electrode 120, the metal oxide 190, the buffer 130, the oxide channel 140, the upper electrode 170, the gate electrode 150, and the gate insulation layer 160 are fixed on the substrate 110. The mold insulator 180 may include an insulating material.

Each of the oxide channel 140, the gate electrode 150, and/or the gate insulating layer 160 may be vertically arranged on the substrate 110, and the semiconductor device 100 may have a 3D structure (e.g., a vertical channel structure). The longitudinal direction of the oxide channel 140 may be vertically arranged on the substrate 110. Here, when the lower electrode 120 is deposited first and then the oxide channel 140 is deposited on the upper surface of the lower electrode 120, the composition of the interface of the lower electrode 120 may be separated, and a Zn-rich composition may be caused. For example, the atomic percent of Zn in a metal contact part of the oxide channel 140 may be higher than the atomic percent of other metal components (for example, when the composition ratio of In, Ga, and Zn in the InGaZnO oxide is 1:1:1, the composition ratio of the metal contact part is 1:1:x, and x is a real number more than 1). The metal contact part may refer to the thickness of 0 nm to 2 nm from the contact interface of the oxide channel 140 in contact with the lower electrode 120 and/or the upper electrode 170. Accordingly, interface resistance of the lower electrode 120 may be increased, and/or device characteristics of the semiconductor device 100 may be deteriorated. However, by introducing the buffer 130 between the lower electrode 120 and the oxide channel 140, it is possible to suppress or at least partially suppress the separation of the interface composition of the lower electrode 120 and lower the interface resistance of the lower electrode 120. When the buffer 130 is introduced between the lower electrode 120 and the oxide channel 140, the atomic percent of In in the metal contact part of the oxide channel 140 may be more than the atomic percent of Zn in the metal contact part of the oxide channel 140. For example, based on a case where the composition ratio of In, Ga, and Zn in the InGaZnO oxide is 1:1:1, the composition ratio of the metal contact part may be y:1:1, and y may be a real number of 1 or more.

Figure 2:
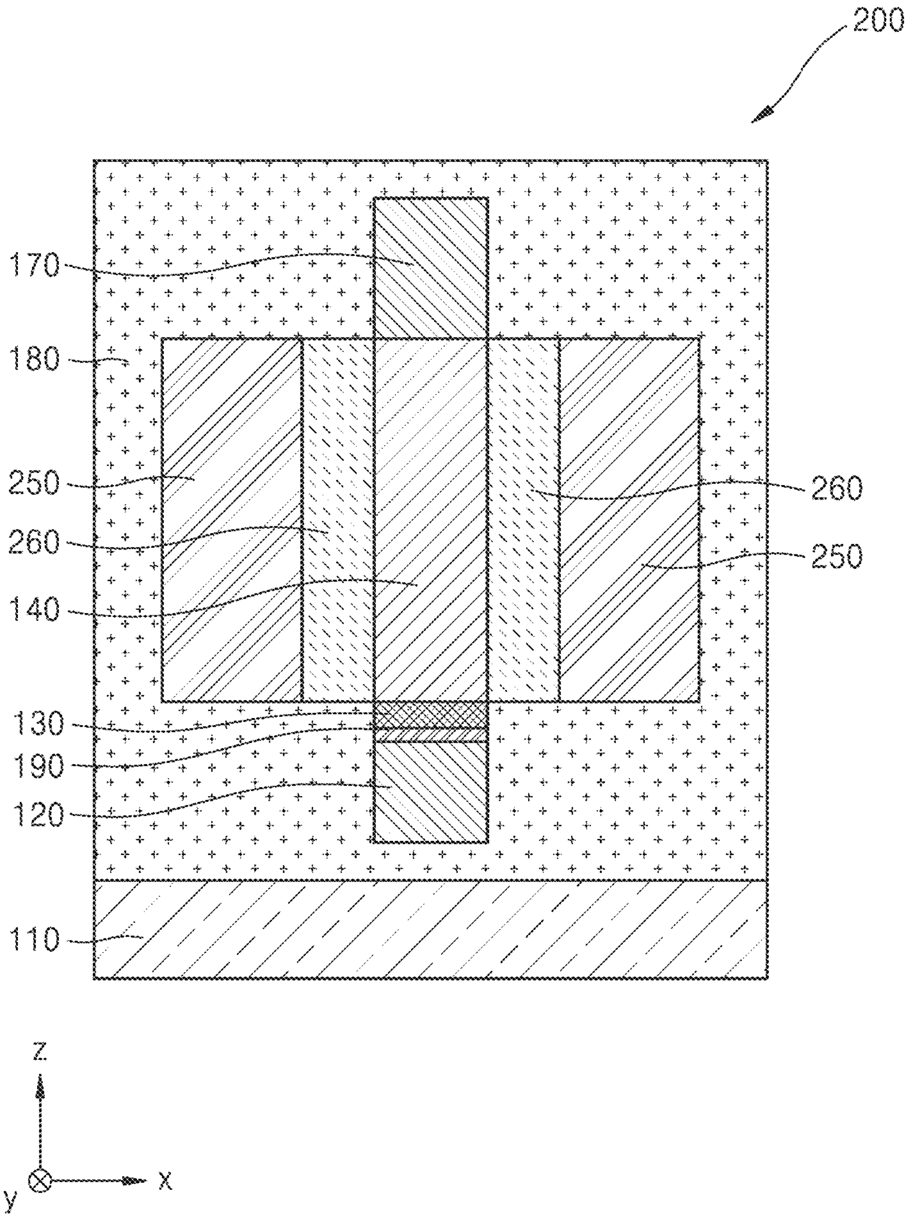
FIG. 2 is a diagram illustrating a semiconductor device including a buffer according to various example embodiments.

FIG. 2 is a diagram illustrating a semiconductor device including a buffer according to various example embodiments. In FIG. 2, components using the same reference numerals as in FIG. 1 have substantially the same configurations and functional effects as those described in FIG. 1, and thus a detailed description thereof will be omitted.

Referring to FIG. 2, the semiconductor device 200 includes a lower electrode 120, a buffer 130, an oxide channel 140, a buffer 130, an oxide channel 140, and an upper electrode 170 arranged in a direction perpendicular to the substrate 110 (z direction). A gate insulating layer 260 may be provided around the oxide channel 140, and a gate electrode 250 may be provided around the gate insulating layer 260. The gate electrode 250 is provided around the oxide channel 140 to expand an area in which the gate electrode 250 faces the oxide channel 140, and to improve a short channel effect.

Figure 3:
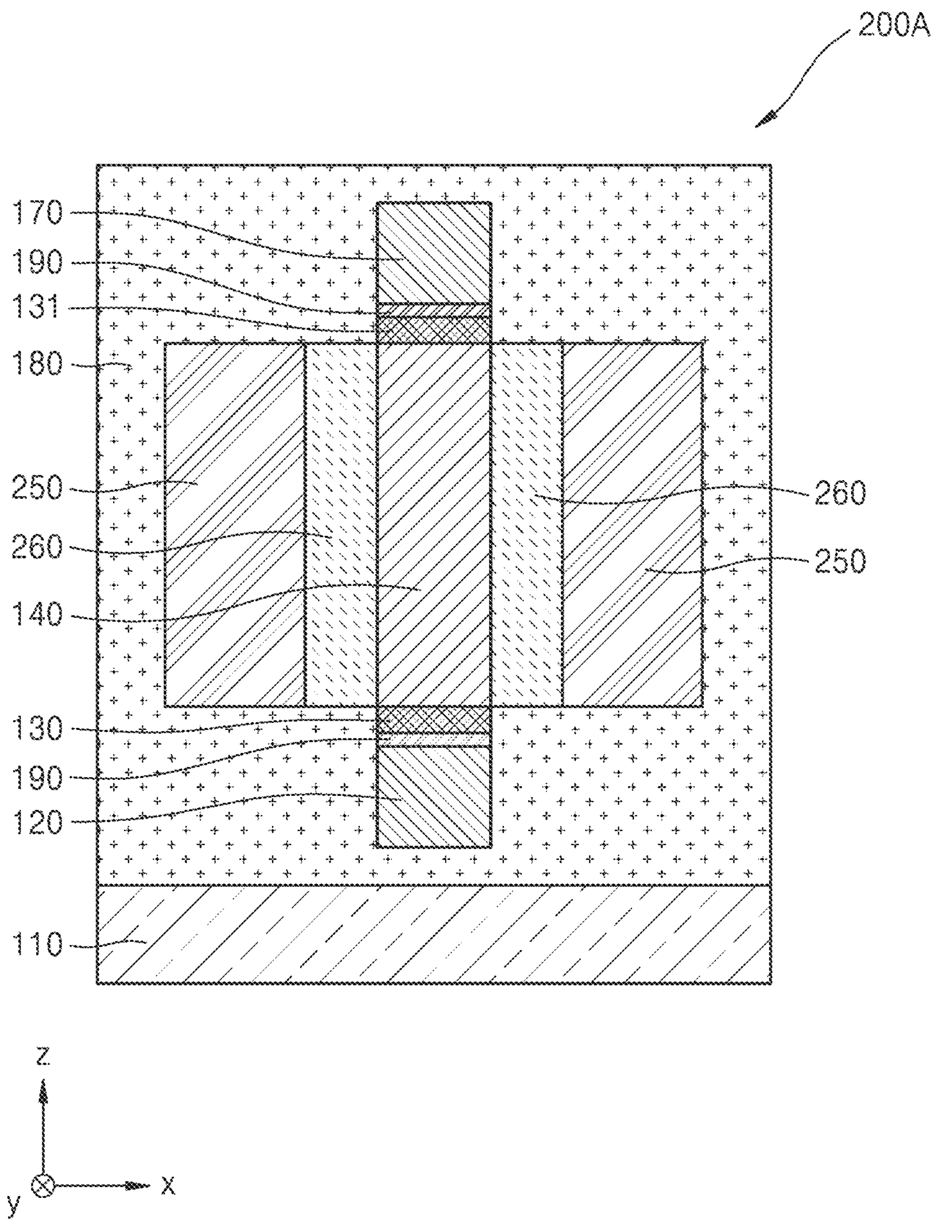
FIG. 3 is a diagram illustrating a semiconductor device including a buffer according to various example embodiments.

FIG. 3 is a diagram illustrating a semiconductor device including a buffer according to various example embodiments. In FIG. 3, components using the same reference numerals as in FIG. 2 have the same configurations and functional effects as in FIG. 2, and thus a detailed description thereof will be omitted.

In FIG. 3, when compared to FIG. 2, the semiconductor device 200A may further include a second buffer 131 between the oxide channel 140 and the upper electrode 170. The second buffer 131 may be positioned between the upper surface of the oxide channel 140 and the lower surface of the upper electrode 170. The second buffer 131 may be positioned in the vertical direction z of the upper electrode 170. The second buffer 131 may include a silicide material (e.g., one or more of $WSi_x$, $RuSi_x$, $NiSi_x$, or $TiSi_x$). Here, x may represent a number greater than 1 and less than 3. Alternatively or additionally, the second buffer 131 may include a metal material (e.g., Mo, Au, Pt, Rh, Ru, Ti, Ta, or Ir) that has a lower oxidation reactivity than the upper electrode 170. The thickness of the second buffer 131 may be about 1 Angstrom to about 50 Angstroms. The second buffer 131 may cover all of the lower surfaces of the upper electrode 170. For example, the width of the second buffer 131 may be the same as the width of the upper electrode 170. The second buffer 131 may include the same silicide materials, and/or different silicide materials, as that of the first buffer 130. A thickness of the second buffer 131 may be the same as, or different from (e.g. greater than or less than), that of the first buffer 130. The metal oxide 190 may be provided between the second buffer 131 and the upper electrode 170.

Figure 4:
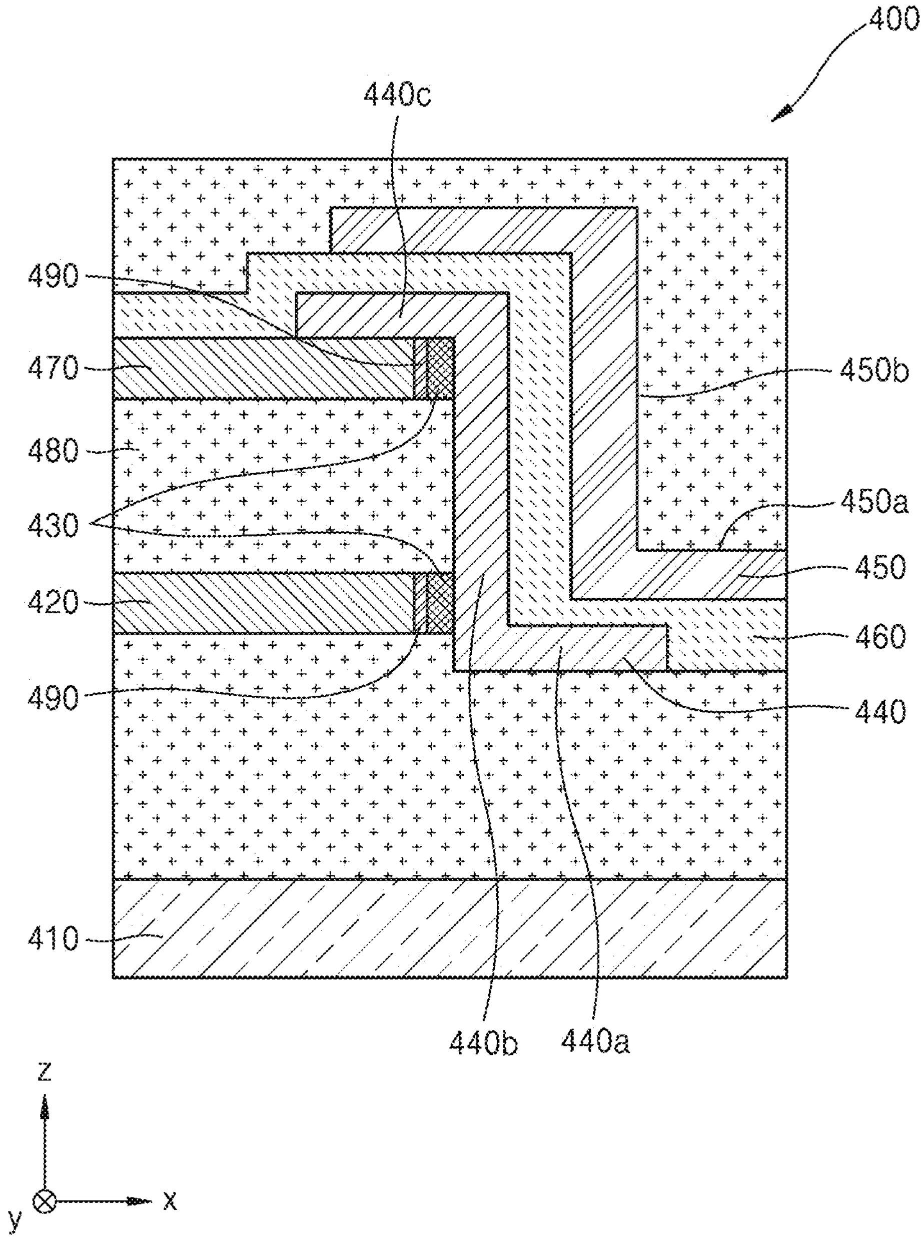
FIG. 4 is a diagram illustrating a semiconductor device including a buffer according to various example embodiments.

FIG. 4 is a diagram illustrating a semiconductor device including a buffer according to various example embodiments.

Referring to FIG. 4, the semiconductor device 400 may include a substrate 410, a lower electrode 420 provided on the substrate 410, and an upper electrode 470 arranged to be spaced apart from the lower electrode 420. The lower electrode 420 and the upper electrode 470 may be spaced apart from each other in a direction (Z direction) perpendicular to the substrate 410. The oxide channel 440 may be arranged outside between the lower electrode 420 and the upper electrode 470. The oxide channel 440 may include a first part 440*a* parallel to the substrate 410, a second part 440*b* in the longitudinal direction which is bent and extended from the first portion 440*a* in a direction perpendicular to the first substrate 410, and a third part 440*c* which is bent and extended from the second part 440*b* in the opposite direction to the first part 440*a*. The second part 440*b* may be placed so as to be on the sides of the lower electrode 420 and the upper electrode 470, and the third part 440*c* may be placed so as to be in contact with the upper electrode 470. At least one buffer 430 may be provided between the lower electrode 420 and the second part 440*b* of the oxide channel 440 and/or between the upper electrode 470 and the second part 440*b* of the oxide channel 440, respectively. Additionally, the metal oxide 490 may be provided between the lower electrode 420 and the buffer 430 or between the upper electrode 470 and the buffer 430. A longitudinal direction (Z direction) of the second portion 440*b* may be arranged in a direction (Z direction) perpendicular to the substrate 410.

The gate electrode 450 may have a shape similar to that of the oxide channel 440 and may be arranged to be spaced apart from the oxide channel 440. For example, the gate electrode 450 may include a first part 450*a* parallel to the substrate 410, a second part 450*b* in the longitudinal direction which is bent and extended from the first portion 450*a* in a direction perpendicular to the first substrate 410, and a third part 450*c* which is bent and extended from the second part 450*b* in the opposite direction to the first part 450*a*. A gate insulating layer 460 may be provided between the oxide channel 440 and the gate electrode 450.

Since the buffer 430 is substantially the same as the buffer 130 and the metal oxide 490 is substantially the same as the metal oxide 190 described with reference to FIG. 1, a detailed description thereof will be omitted.

FIG. 5 is a diagram illustrating a semiconductor device including a buffer according to various example embodiments.

Referring to FIG. 5, the semiconductor device 500 may include a substrate 510, a lower electrode 520, a metal oxide 590 provided on, in, or at least partially within the lower electrode 520, a buffer 530 provided on the metal oxide 590, and an oxide channel 540 provided in the buffer 530.

The oxide channel 540 may have a U-shaped cross-sectional shape. The oxide channel 540 may include a bottom part 543 in contact with the buffer 530, a first vertical extension part 541 extending in a direction perpendicular to the lower electrode 520 from one end of the bottom part 543, and a second vertical extension part 542 extending in a direction perpendicular to the lower electrode 520 from the other end of the bottom part 543. The first vertical extension part 541 and/or the second vertical extension part 542 in the longitudinal direction of the oxide channel 540 may be provided perpendicularly to the substrate.

A first gate electrode 551 may be spaced apart from the first vertical extension 541, and a second gate electrode 552 may be spaced apart from the second vertical extension 542. A first gate insulating layer 561 may be provided between the first vertical extension part 541 and the first gate electrode 551, and a second gate insulating layer 562 may be provided between the second vertical extension part 542 and the second gate electrode 552.

The first gate electrode 551 and/or the second gate electrode 552 may extend in a second horizontal direction (Y direction). The first gate electrode 551 and the second gate electrode 552 may be spaced apart from each other. The first gate electrode 551 and/or the second gate electrode 552 may constitute or correspond to a word line WL (cf. FIG. 24). The electrical signal input to the first gate electrode 551 may not match the electrical signal input to the second gate electrode 552. The first gate electrode 551 may control the channel of the first vertical extension part 541, and the second gate electrode 552 may control the channel of the second vertical extension part 542.

An insulating liner 591 may be arranged between the first gate electrode 551 and the second gate electrode 552 spaced apart from each other. The insulating liner 591 may be conformally arranged on the side walls in which the first gate electrode 551 faces the second gate electrode 552, and/or the upper surface of the oxide channel 540. The insulating liner 591 may have an upper surface arranged on the same plane as the upper surfaces of the first gate electrode 551 and the second gate electrode 552. The insulating liner 591 may include, for example, silicon nitride. A buried insulating layer 592 may fill a space between the first gate electrode 551 and the second gate electrode 552 spaced apart from each other on the insulating liner 591. The buried insulating layer 592 may include, for example, silicon oxide. An upper insulating layer 593 may be arranged on the upper surfaces of the first gate electrode 551, the second gate electrode 552, and/or the buried insulating layer 592. The upper surface of the upper insulating layer 593 may be arranged at the same level as the upper surface of the mold insulator 580.

The upper electrode 570 may be arranged on the oxide channel 540. The upper electrode 570 may serve as or correspond to a landing pad. The upper electrode 570 may include a left upper electrode and a right upper electrode. The left upper electrode may be electrically connected to the first vertical extension 541. The right upper electrode may be electrically connected to the second vertical extension 542. The left upper electrode and the right upper electrode may not be electrically connected with each other. The upper electrode 570 may include an upper portion and a lower portion. The upper portion of the upper electrode 570 may be a portion of the upper electrode 570 arranged at a higher level than the upper surface of the mold insulator 580. The lower part of the upper electrode 570 may be a part of the upper electrode 570 arranged inside an upper electrode recess defined between the mold insulator 580 and the upper insulating layer 593. In various example embodiments, the upper part of the upper electrode 570 may have a first width w1 in a first horizontal direction (X), and the lower part of the upper electrode 570 may have a second width w2 smaller than the first width w1 in the first horizontal direction (X). The lower part of the upper electrode 570 may be arranged inside the upper electrode recess, and the upper part of the upper electrode 570 may have a bottom surface arranged on the upper surface of the mold insulator 580 and the upper surface of the upper insulating layer 593. Accordingly, the upper electrode 570 may have a T-shaped vertical cross-section. A bottom surface of the lower part of the upper electrode 570 may contact the upper portions of the surfaces of the first vertical extension part 541 and/or the second vertical extension part 542. Both sidewalls of the lower portion of the upper electrode 570 may be aligned with both sidewalls of the first vertical extension part 541 and the second vertical extension part 542. The bottom surface of the lower part of the upper electrode 570 may be arranged at a higher level than the upper surface of the first gate electrode 551 and/or the upper surface of the second gate electrode 552, and a part of the sidewall of the lower part of the upper electrode 570 may be covered by the first gate insulating layer 561 and/or the second gate insulating layer 562. An upper electrode insulating layer 594, which surrounds the upper electrode 570, may be arranged on the upper surfaces of the mold insulator 580 and the upper insulating layer 593. The semiconductor device 500 may have a vertical channel transistor (VCT) structure including a vertical channel region extending in the vertical direction (z) of the lower electrode 520.

Since the buffer 530 is substantially the same as the buffer 130 and the metal oxide 590 is substantially the same as the metal oxide 190 described with reference to FIG. 1, a detailed description thereof will be omitted.

Figure 6:
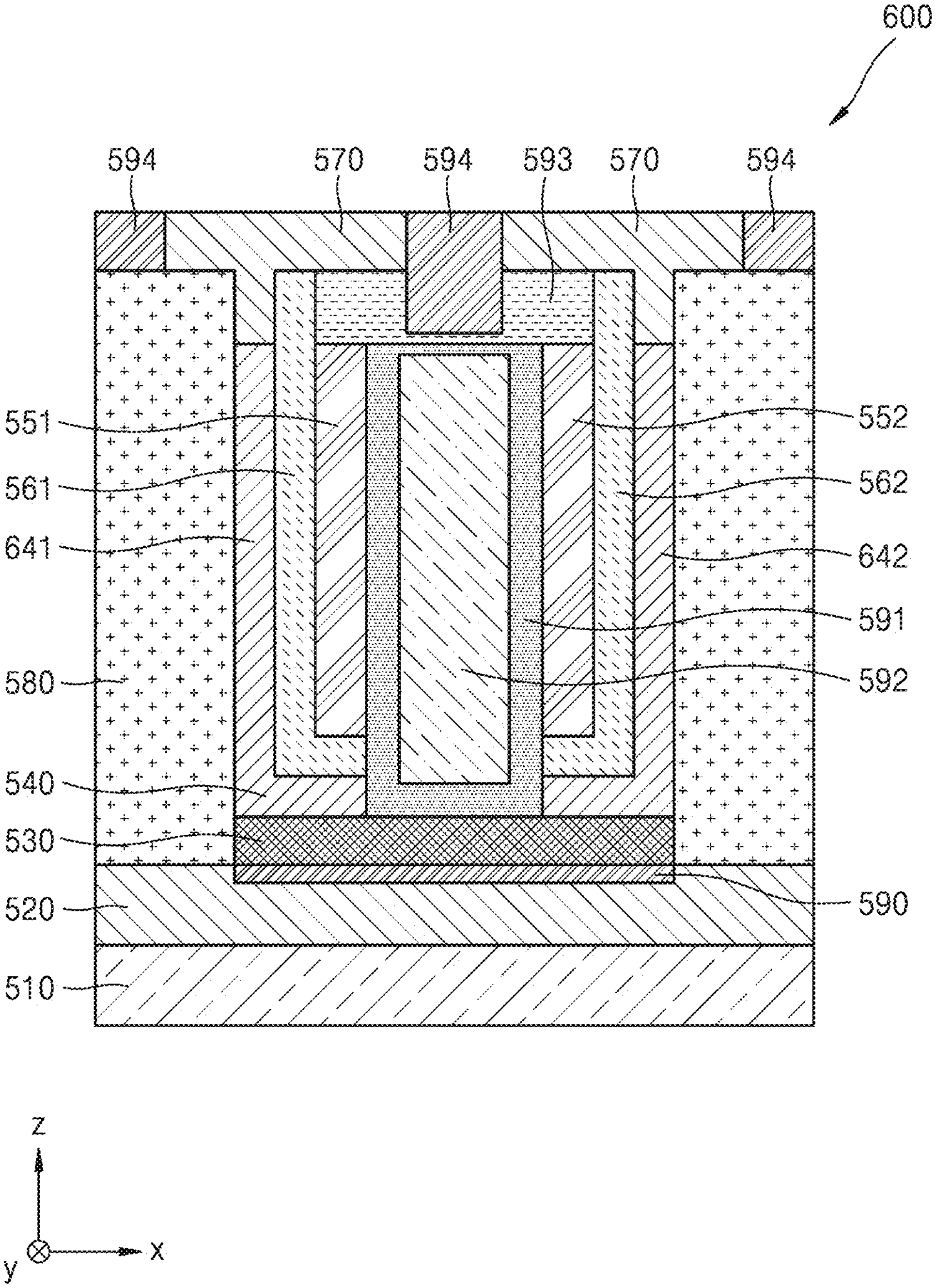
FIG. 6 is a diagram illustrating a semiconductor device including a buffer according to various example embodiments.

FIG. 6 is a diagram illustrating a semiconductor device including a buffer according to various example embodiments.

Referring to FIG. 6, since components using the same reference numerals as those in FIG. 6 have substantially the same configurations and functional effects, a detailed description thereof will be omitted.

When compared to FIG. 5, the shape of the oxide channel of FIG. 6 may be different from that of FIG. 5. The oxide channel may include a first oxide channel 641 and a second oxide channel 642. The first oxide channel 641 may have an L-sectional shape, and the second oxide channel 642 may have a shape symmetrical to the first oxide channel 641 in the z-direction. The first oxide channel 641 and the second oxide channel 642 are separated from each other.

The first oxide channel 641 and the second oxide channel 642 may be positioned so that the longitudinal directions thereof are arranged in a direction (z direction) perpendicular to the substrate (not illustrated).

Figure 7:
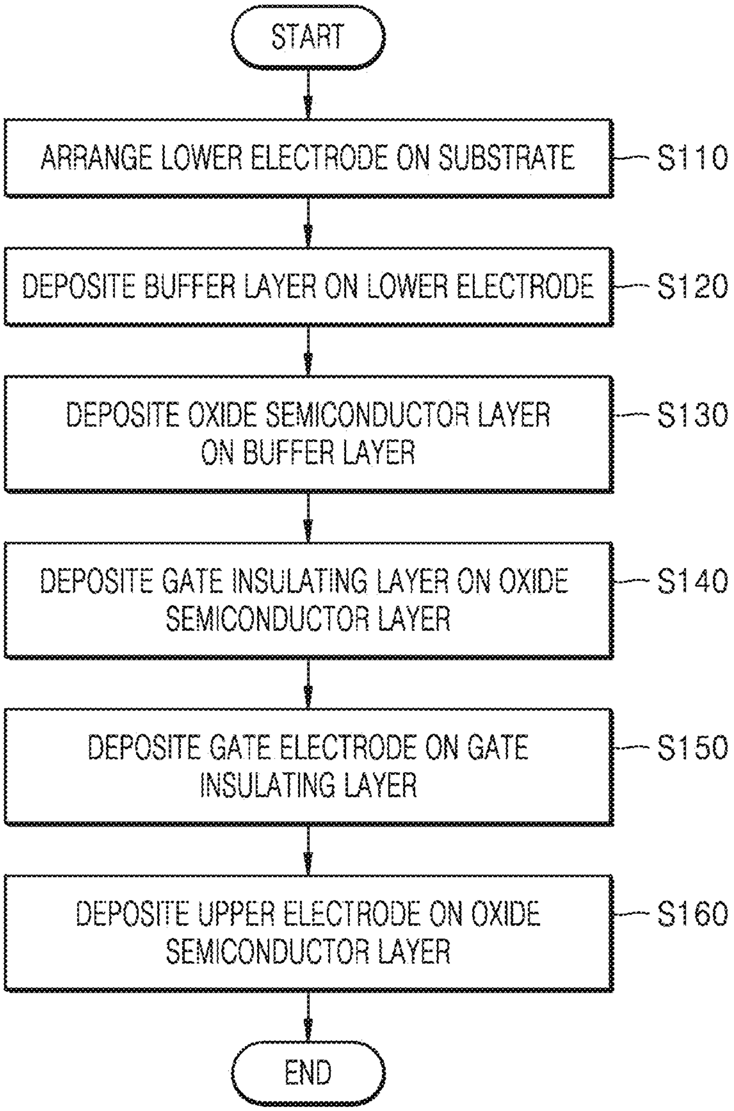
FIG. 7 is a flowchart illustrating a method of manufacturing a semiconductor device including a buffer according to various example embodiments.

FIG. 7 is a flowchart illustrating a method of manufacturing a semiconductor device including a buffer according to various example embodiments.

Referring to FIG. 7, a method of manufacturing a semiconductor device including a buffer according to various example embodiments includes: arranging a lower electrode 120 on a substrate 110 (S110); depositing a buffer (layer) 130 on the lower electrode 120 (S120); depositing an oxide channel (layer) 140 on the buffer (layer) 130 (S130); depositing a gate insulating layer 160 on the oxide channel 140 (S140); depositing a gate electrode 150 on the gate insulating layer 160 (S150); and depositing an upper electrode 170 on the oxide channel (layer) 140 (S160). The depositing of the oxide channel (layer) 140 on the buffer (layer) 130 (S130) may include one or more of a sputtering process, an ALD process, or a PE-ALD process.

Figure 8:
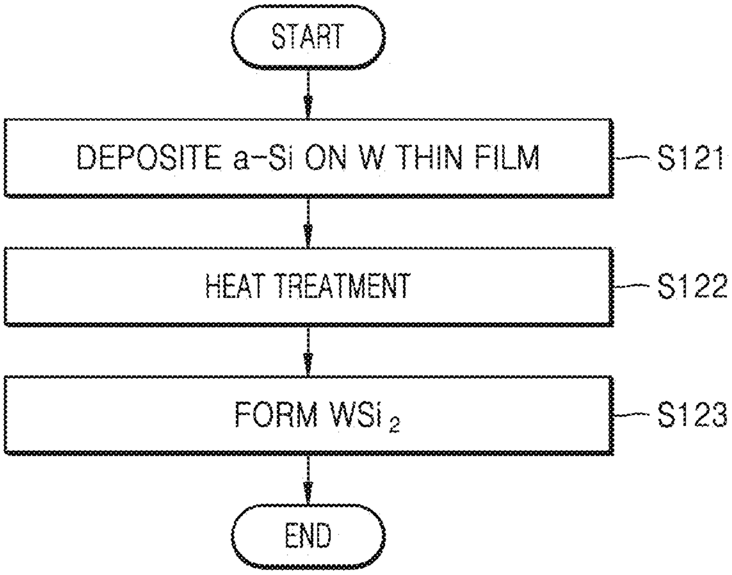
FIG. 8 is a flowchart illustrating an operation of depositing a buffer in a method of manufacturing a semiconductor device including a buffer according to various example embodiments.

FIG. 8 is a flowchart illustrating an operation of depositing a buffer in a method of manufacturing a semiconductor device including a buffer according to various example embodiments.

Referring to FIG. 8, the depositing of the buffer 130 on the lower electrode 120 (S120) may include, for example, depositing a-Si (metal-silicon composite layer) on a tungsten (W) thin film (S121), and heat treatment (S122), and forming $WSi_2$ (S123), when the lower electrode 120 includes tungsten (W).

Next, a method of manufacturing a semiconductor device according to various example embodiments will be described with reference to FIGS. 9 to 17.

Figure 9:
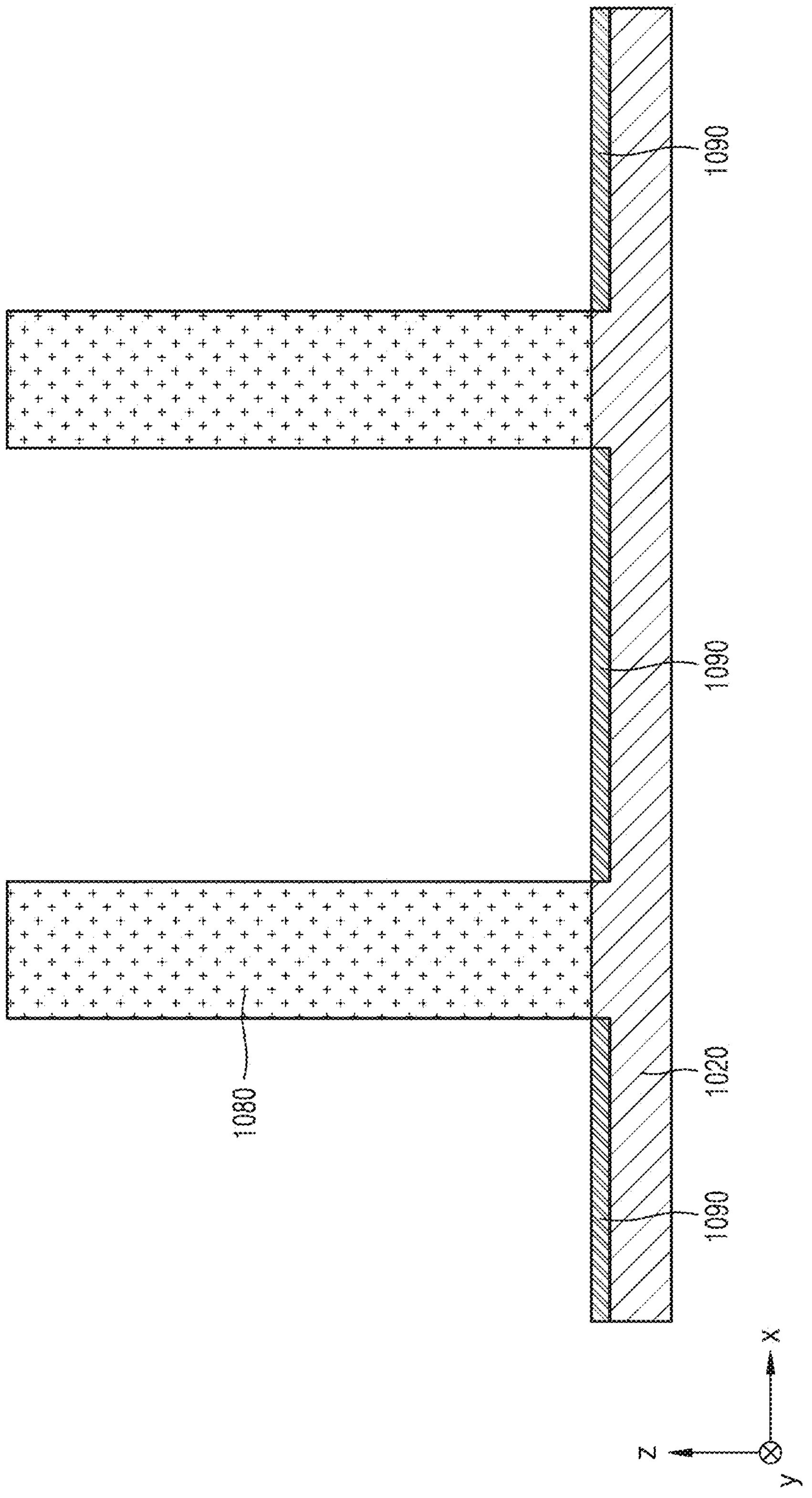
FIGS. 9 to 17 are diagrams for describing a method of manufacturing a semiconductor device according to various example embodiments.

Referring to FIG. 9, a plurality of mold insulators 1080 extending in the second horizontal direction y may be deposited on the lower electrode 1020 extending in the first horizontal direction x. The mold insulators 1080 may be stacked in the vertical direction z until the mold insulator 1080 has a determined (e.g., predetermined or variably determined) height. The plurality of mold insulators 1080 and the lower electrode 1020 may form openings. The metal oxide 1090 may be formed in the lower electrode 1020. In the following process of depositing the oxide channel 1040, an oxidation reaction may occur between an oxidant included in a precursor of the oxide channel 1040 and the lower electrode 1020, and the metal oxide 1090 may be formed. Even when the lower electrode 1020 is oxidized, formation of the metal oxide 1090 may be limited by the buffer 1030. For example, the thickness of the metal oxide 1090 may be about 5 nm or less. Some of oxygen included in the oxidant may be left in the buffer 1030 when passing through the buffer 1030, and the other may react to the lower electrode 1020 to from the metal oxide 1090.

Figure 10:
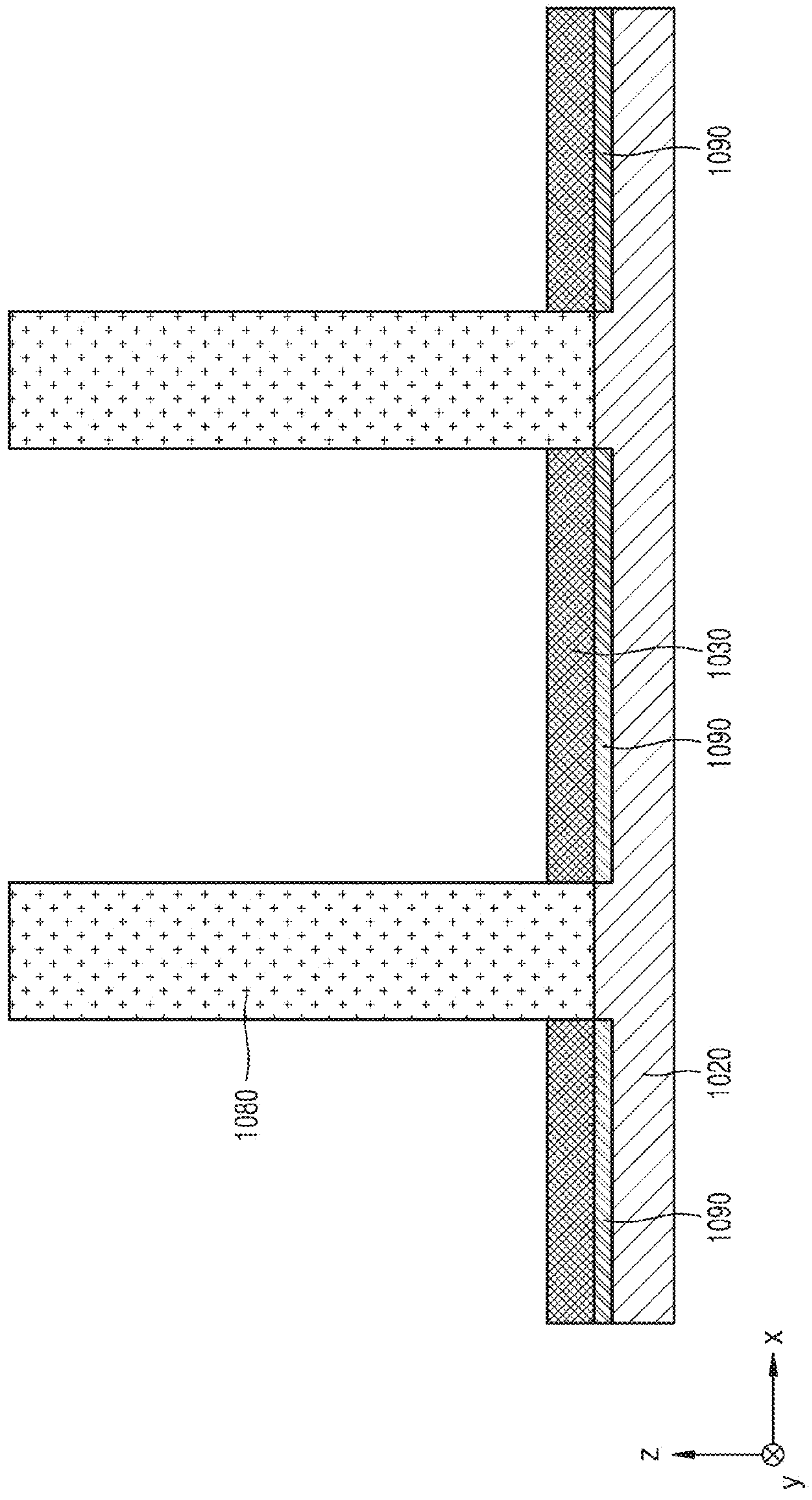

Referring to FIG. 10, the buffer 1030 may be stacked on the lower electrode 1020 (or, the metal oxide 1090). The thickness of the buffer 1030 may be 1 about Angstrom to 50 about Angstroms. The buffer 1030 may include a silicide material (e.g., tungsten silicide, ruthenium silicide nickel silicide, and titanium silicide. Here, x may represent a number greater than 1 and less than 3. Alternatively or additionally, the buffer 1030 may include a metal (e.g., one or more of Mo, Au, Pt, or Rh) that has a lower oxidation reactivity than the lower electrode 1020.

Figure 11:
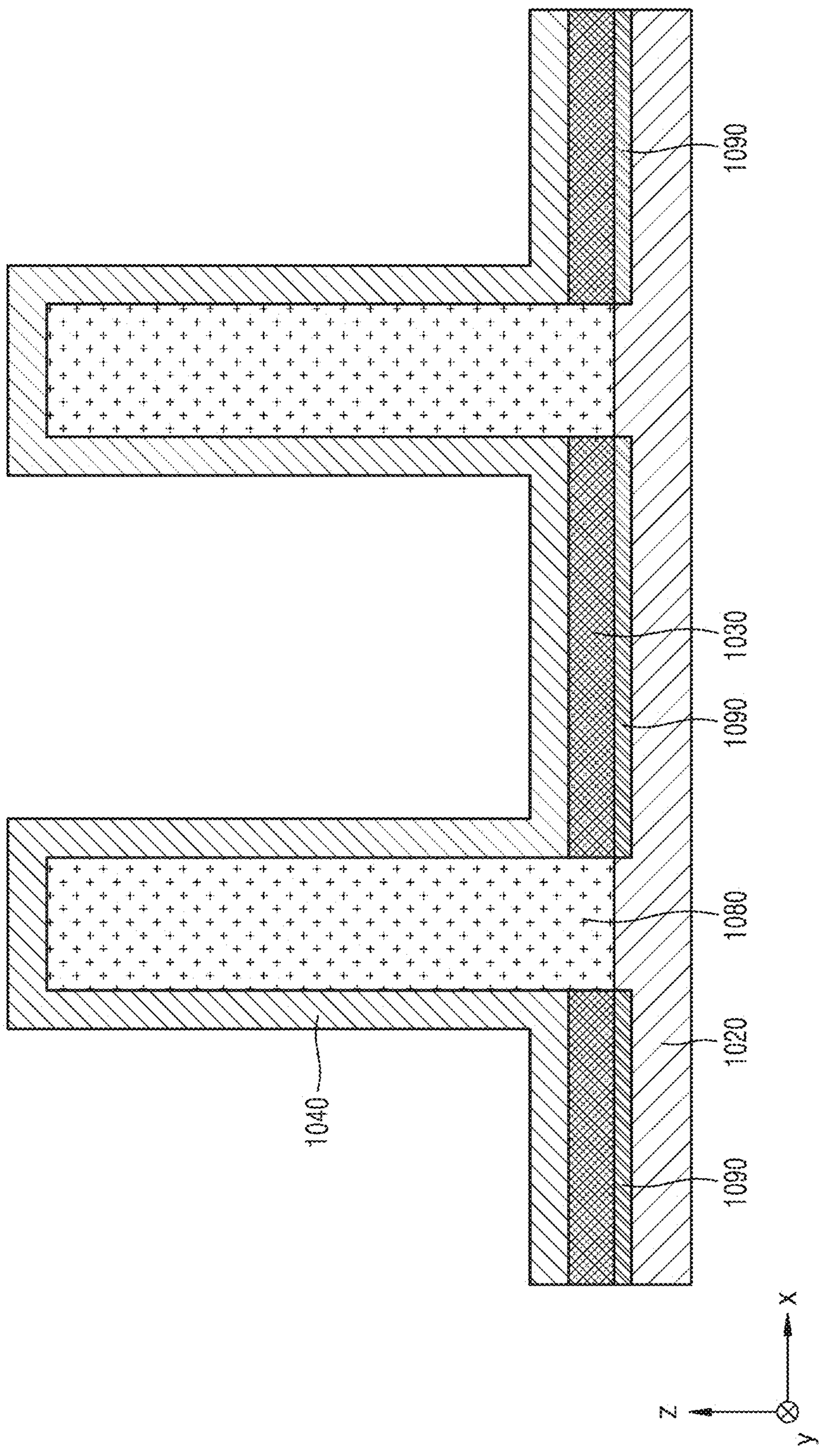
Figure 12:
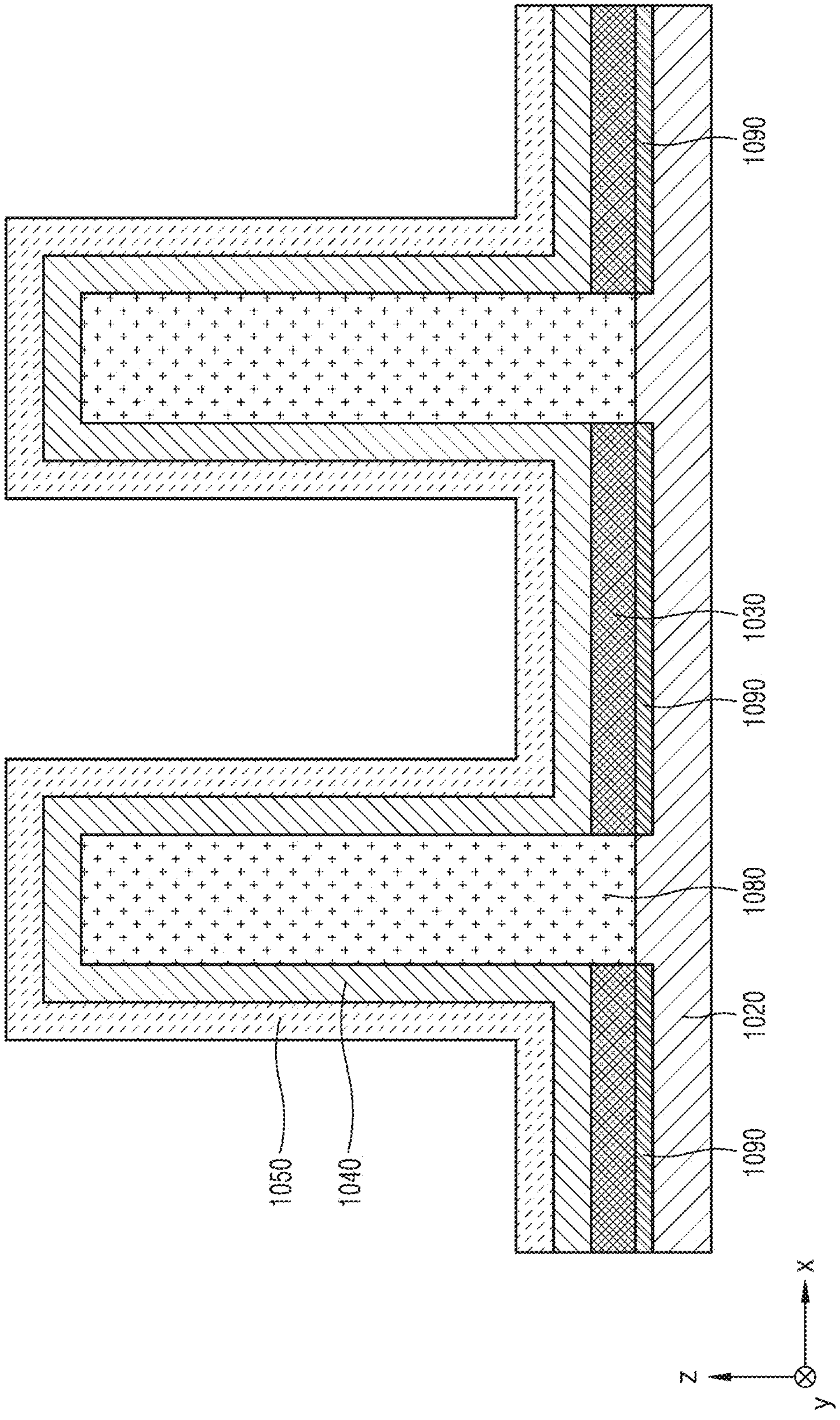
Figure 13:
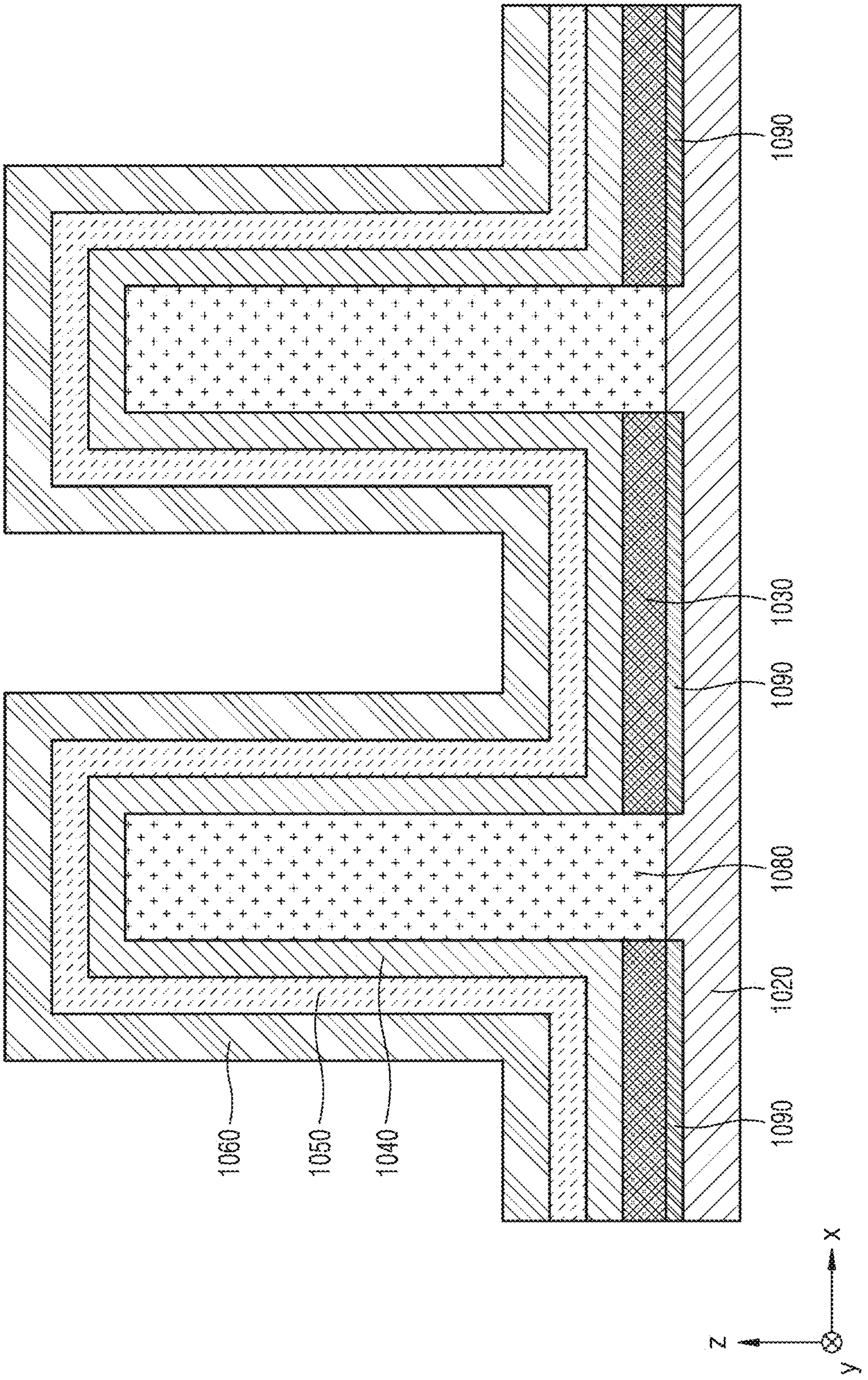

Referring to FIG. 11, an oxide channel 1040 may be deposited on the buffer 1030 and the mold insulators 1080. The oxide channel 1040 may be deposited by a sputtering method, a thermal-ALD method, or a PE-ALD method. The oxide channel 1040 may have a U-shaped cross-sectional shape. Referring to FIG. 12, a gate electrode 1050 may be stacked on a surface of the oxide channel 1040. Referring to FIG. 13, a gate insulating layer 1060 may be stacked on a surface of the gate electrode 1050.

Figure 14:
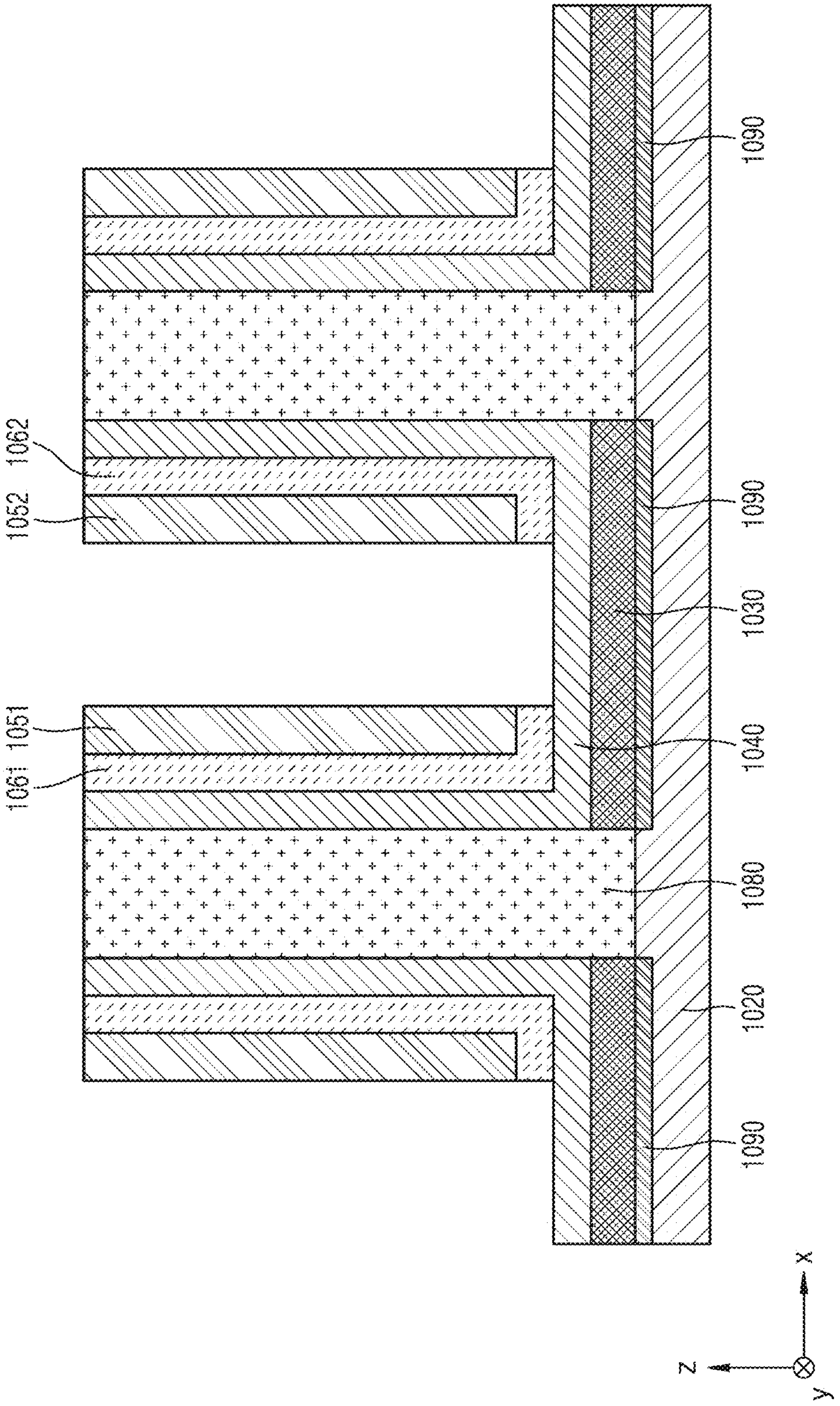

Referring to FIG. 14, anisotropic etching may be performed from an upper portion of the gate electrode 1050 of the structure shown in FIG. 12. In the upper direction of the mold insulator 1080, the gate electrode 1050, the gate insulation layer 1060 and the oxide channel 1040 may be etched to expose the upper surface of the mold insulator 1080. Accordingly, the gate electrode 1050 may be separated into a first gate electrode 1051 and a second gate electrode 1052, and the gate insulating layer 1060 may be separated into a first gate insulating layer 1061 and a second gate insulating layer 1062. In addition, in the upper direction of the mold insulator 1080, the gate electrode 1050, the gate insulation layer 1060 and the oxide channel 1040 may be etched to expose the upper surface of the mold insulator 1080. Levels of the upper surface of the mold insulation 1080, the upper surfaces of the first gate electrode 1051 and the second gate electrode 1052, and the upper surfaces of the first gate insulation layer 1061 and the second gate insulation layer 1062 may match one another. When etching is performed on the gate electrode 1050 once more, the levels of the upper surfaces of the first gate insulation layer 1061 and the second gate insulation layer 1062 may be lower than the levels of the upper surfaces of the mold insulator 1080, the first oxide channel 1041, and the second oxide channel 1042, and the upper surfaces of the first gate electrode 1051 and the second gate electrode 1052.

The gate electrode 1050 and/or the gate insulating layer 1060 may be etched toward the bottom of the openings to partially expose the upper surface of the oxide channel 1040.

Figure 15:
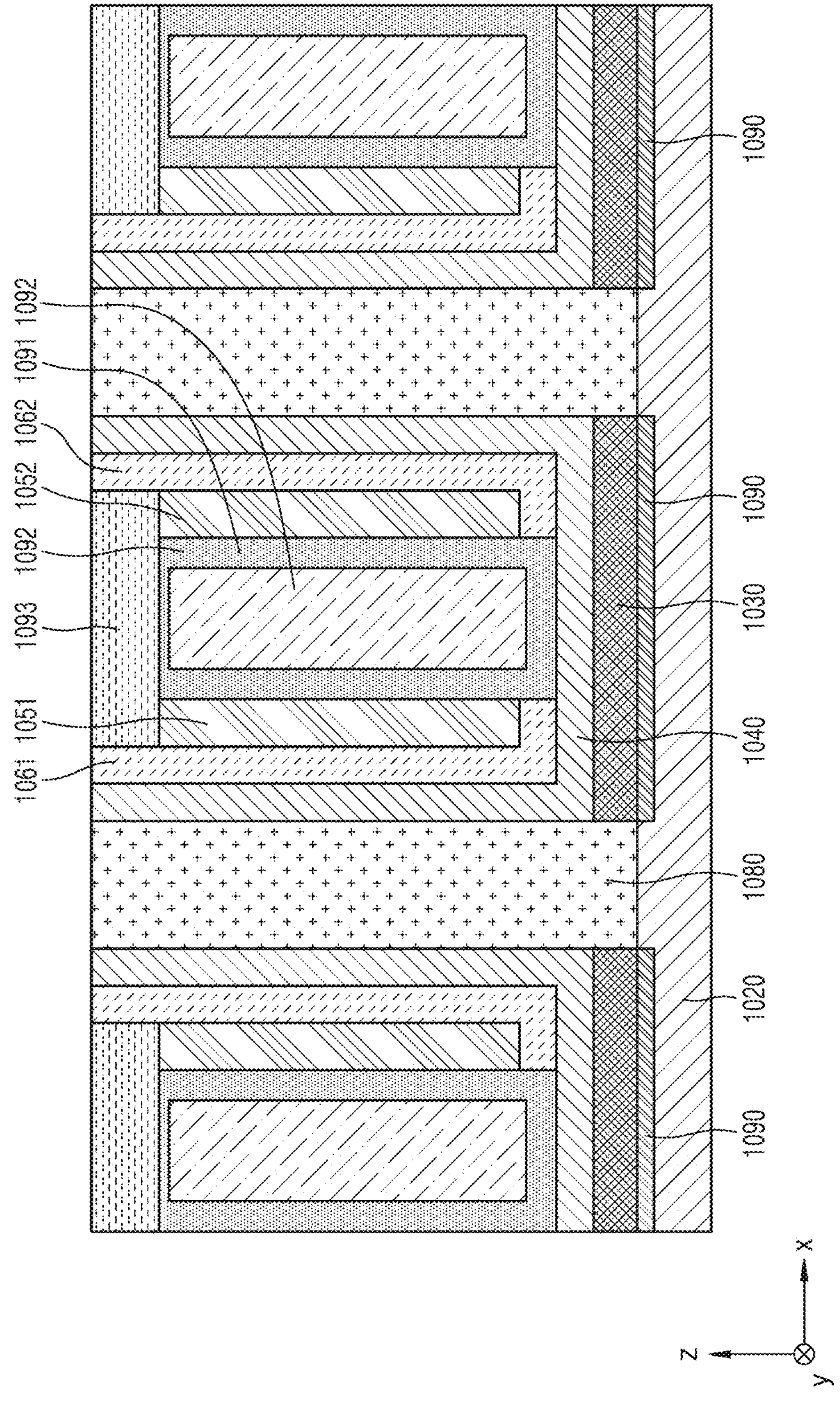

Referring to FIG. 15, an insulating liner 1091 may be deposited from a surface of the bottom part of the oxide channel 1040 and stacked up to the level of the upper surfaces of the first gate electrode 1051 and/or the second gate electrode 1052. An upper insulating layer 109 may be deposited on the upper surfaces of the first gate electrode 1051 and/or the second gate electrode 1052 and the upper surface of the insulating liner 1091. The upper insulating liner 1091 and the buried insulating layer 1092 may not be distinguished from each other. The level of the surface of the upper insulation layer 1093 may coincide with the levels of the upper surface of the mold insulator 1080, the upper surfaces of the first oxide channel 1041 and the second oxide channel 1042, the upper surfaces of the first gate electrode 1051 and the second gate electrode 152, and the upper surfaces of the first gate insulating layer 1061 and the second gate insulating layer 1062.

Figure 16:
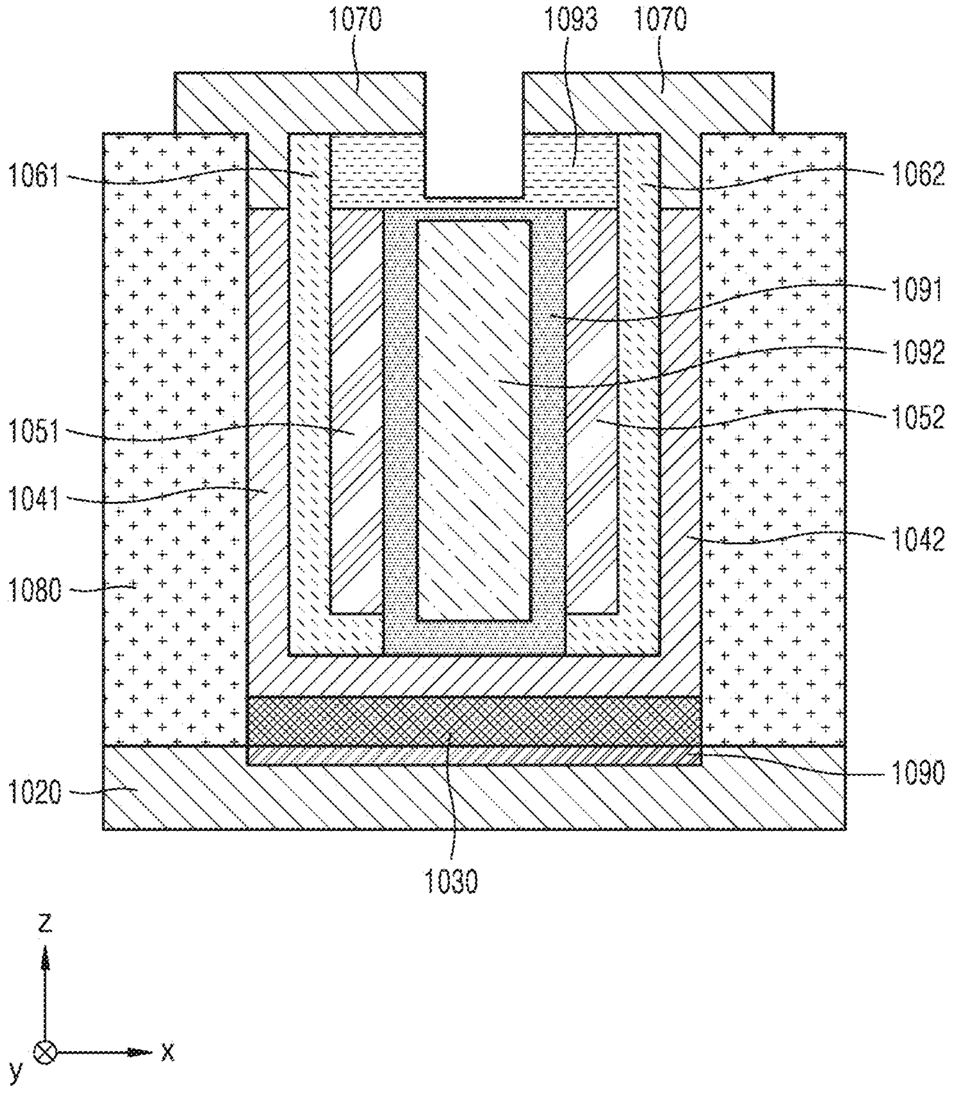

Referring to FIG. 16, some parts of the upper surfaces of the first oxide channel 1041 and the second oxide channel 1042 may be etched, and an upper electrode 1070 may be deposited on upper portions of the first oxide channel 1041 and the second oxide channel 1042. After depositing the upper electrode 1070, a central portion of the upper electrode 1070 and an upper portion of the upper insulating layer 1093 may be partially etched.

Figure 17:
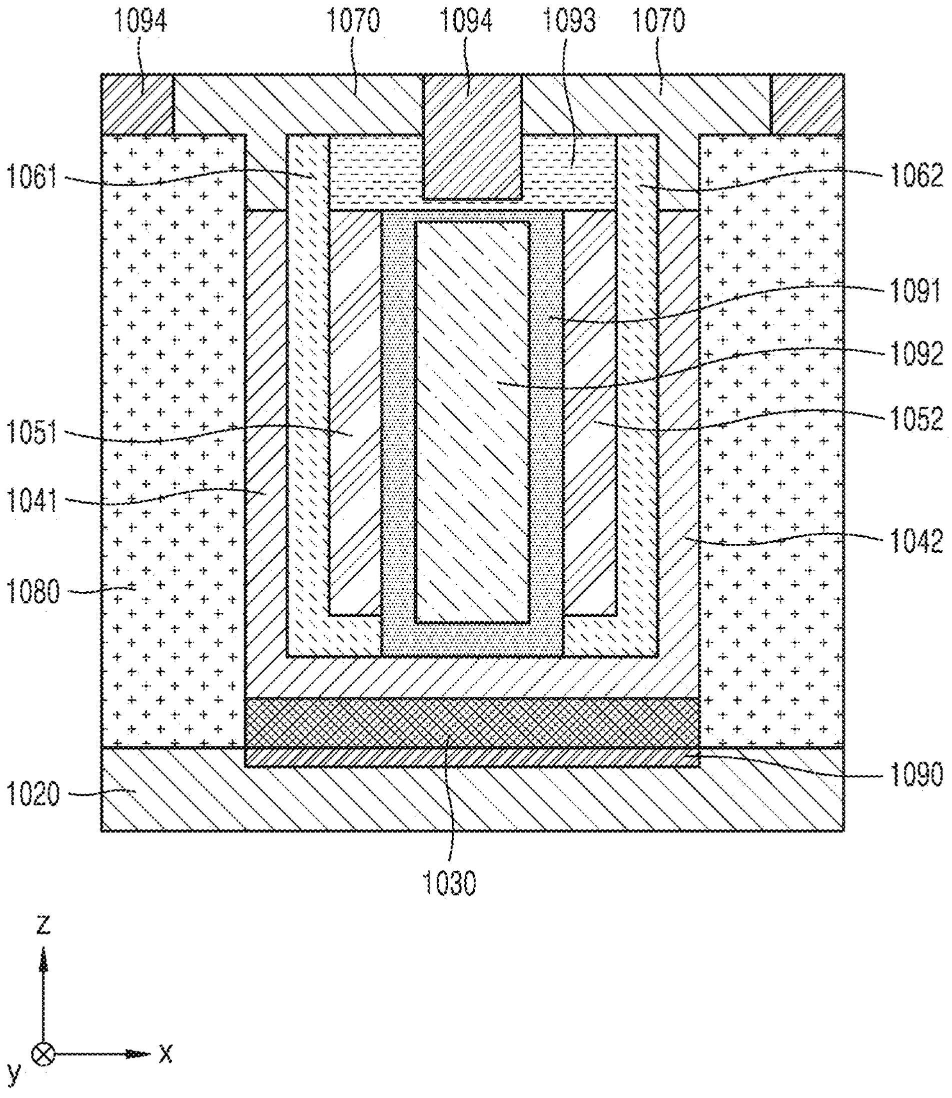

Referring to FIG. 17, an upper electrode insulating layer 1094 may deposited between the upper electrodes 1070 and a part of an upper portion of the upper insulating layer 1093. An upper surface level of the upper electrode insulating layer 1094 and a surface level of the upper electrode 1070 may coincide with each other.

FIGS. 18 to 21 are diagrams for describing a method of manufacturing a semiconductor device according to various example embodiments.

Figure 18:
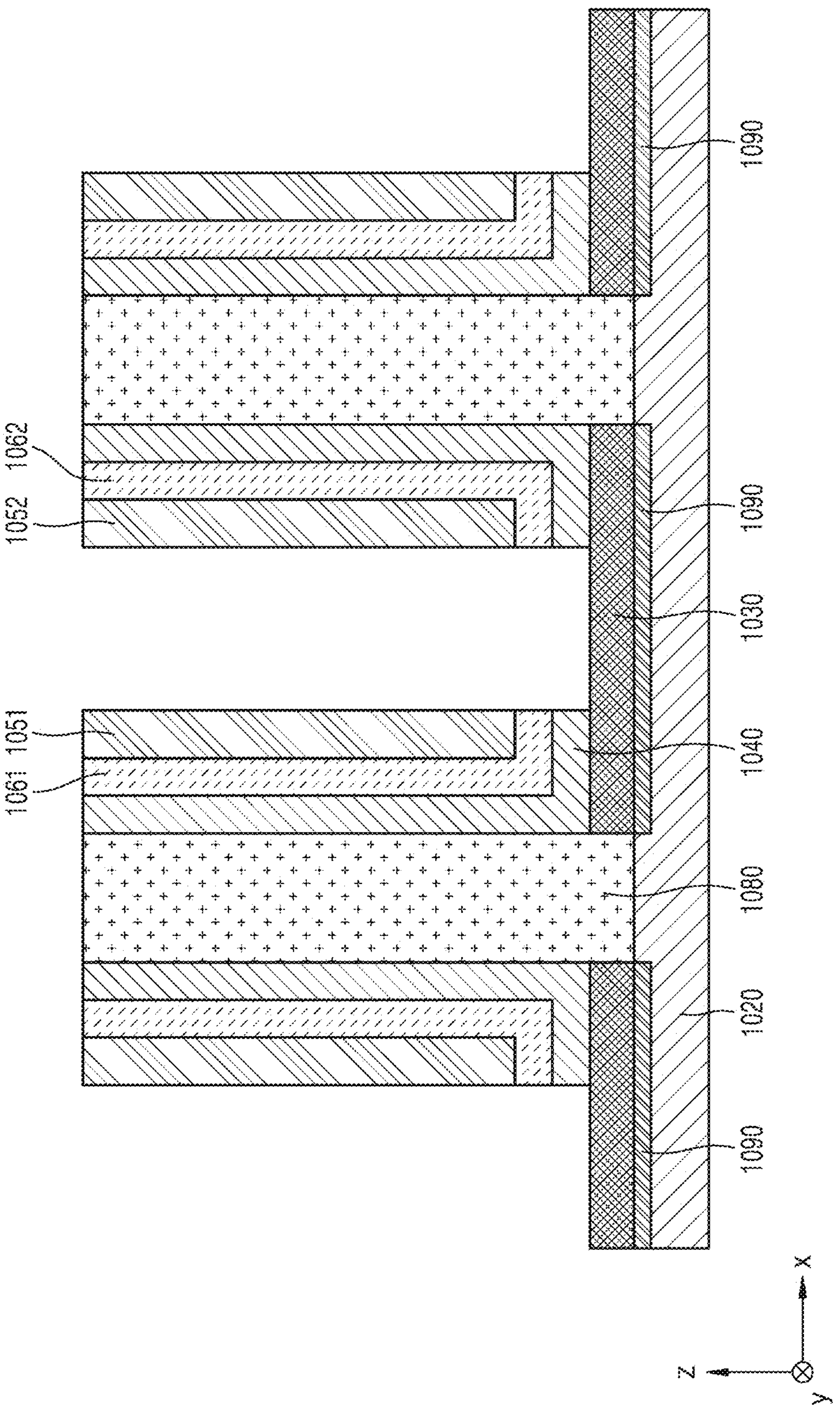
FIGS. 18 to 21 are diagrams for describing a method of manufacturing a semiconductor device according to various example embodiments.

Referring to FIG. 18, some parts of the gate electrode 1050, the gate insulating layer 1060 and the oxide channel 1040 may be etched in a bottom direction of an opening, and thus a surface of the buffer 1030 may be partially exposed.

Figure 19:
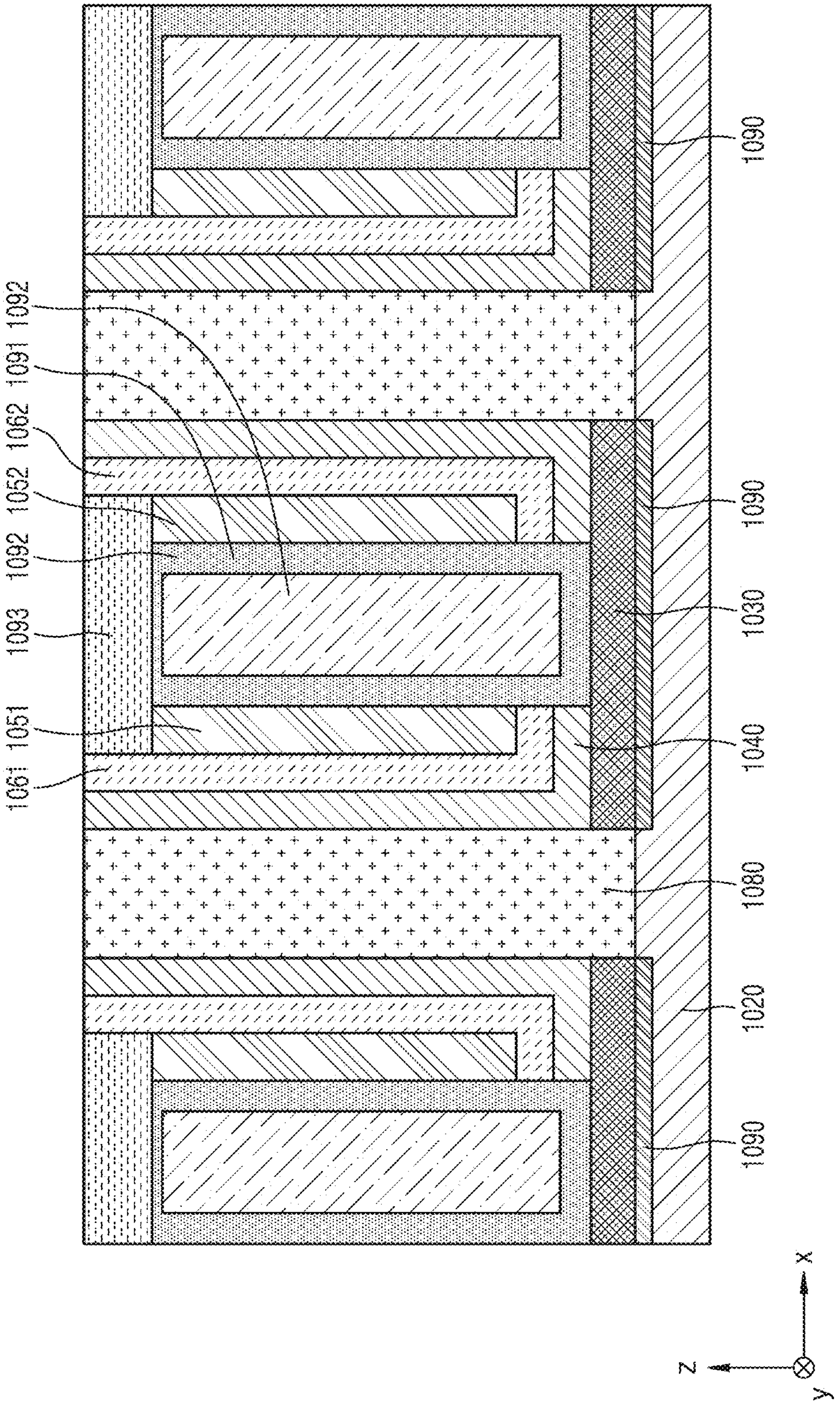
Figure 21:
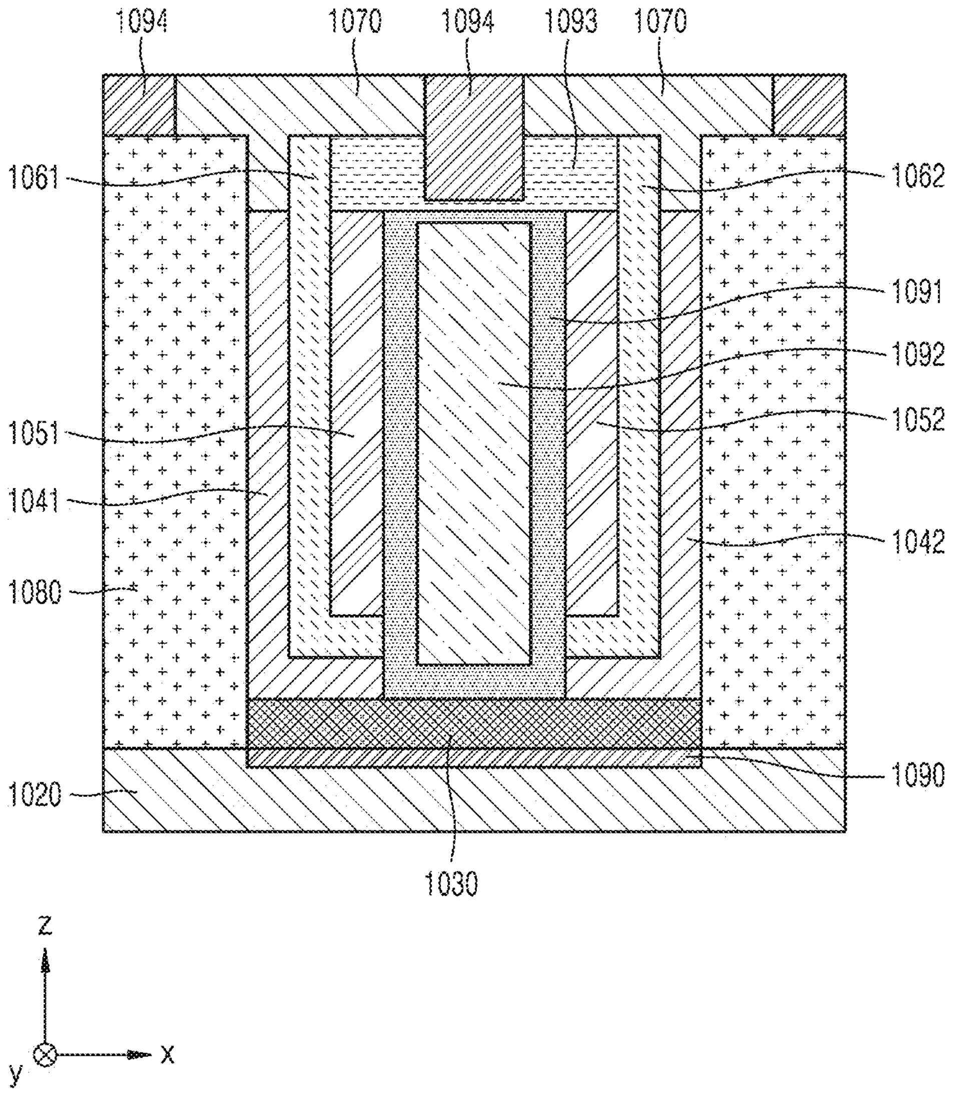

Referring to FIG. 19, similarly to FIG. 21, the insulating liner 1091 may be deposited from the upper surface of the buffer 1030 and stacked up to the levels of an upper surfaces of the first gate electrode 1051 and/or the second gate electrode 1052.

Figure 20:
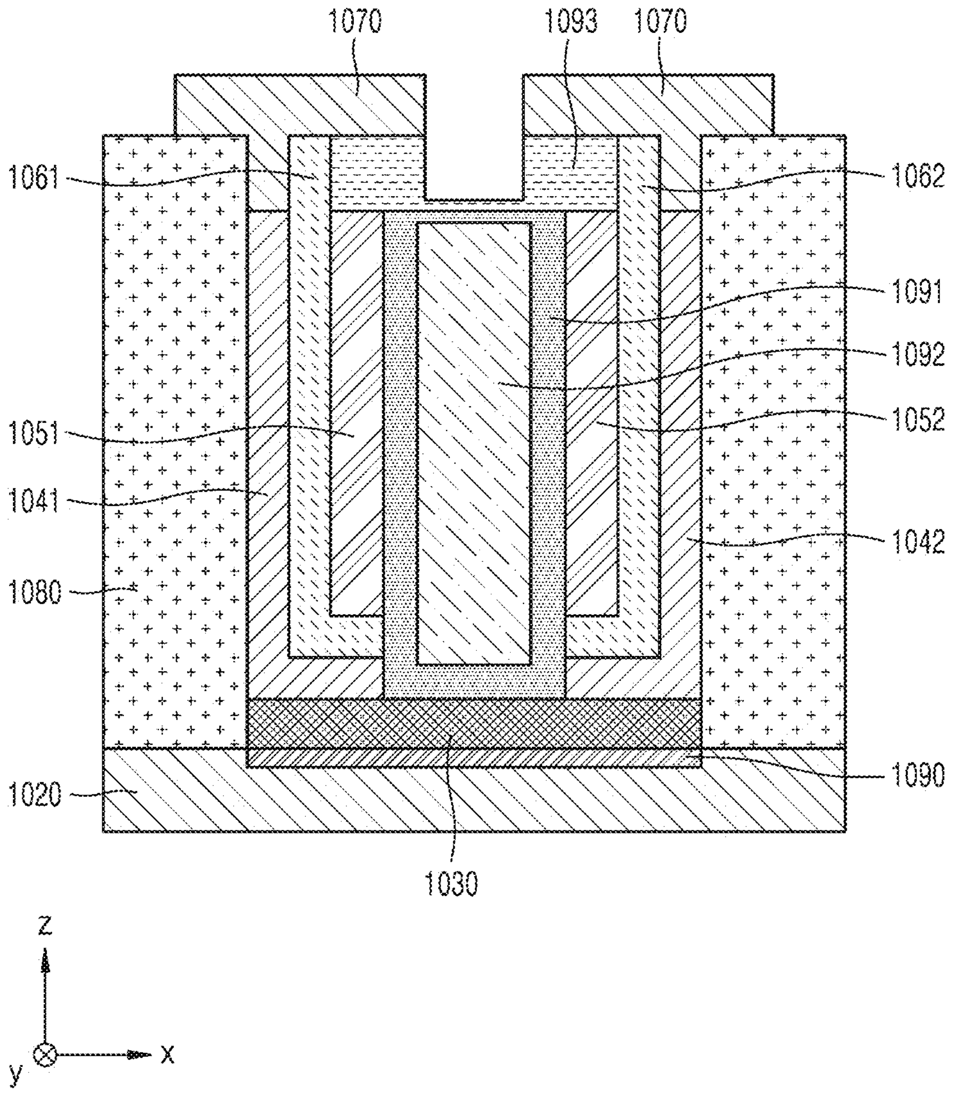

Referring to FIG. 20, similarly to FIG. 16, some parts of the upper surfaces of the first oxide channel 1041 and the second oxide channel 1042 may be etched, and the upper electrode 1070 may be deposited on upper surfaces of the first oxide channel 1041 and the second oxide channel 1042. After depositing the upper electrode 1070, a central portion of the upper electrode 1070 and an upper portion of the upper insulating layer 1093 may be partially etched.

Referring to FIG. 21, similarly to FIG. 17, the upper electrode insulating layer 1094 may cover some portions between the upper electrode 1070 and a part of the upper portion of the upper insulating layer 1093. An upper surface level of the upper electrode insulating layer 1094 and a surface level of the upper electrode 1070 may coincide with each other.

The method of manufacturing a semiconductor device including a buffer according to an embodiment may provide the semiconductor including the buffer 1030 between the lower electrode 1020 and the oxide channel 1040 to improve performance of the semiconductor device. For example, the buffer 1030 may include silicide material or metal having lower reactivity with oxygen than an electrode material to oxygen, and the oxygen source may not pass through the buffer 1030. Accordingly, the reaction between the lower electrode 1020 and the oxygen source may be substantially prevented during the process of forming the oxide channel 1040.

The semiconductor device according to various example embodiments is suitable for application to an integrated circuit device having a high degree of integration because it has a micro size and excellent electrical performance.

The semiconductor device according to various example embodiments may constitute a transistor applied for a digital circuit or an analog circuit. In some embodiments, an example semiconductor device may be used as a high voltage transistor or a low voltage transistor. For example, a semiconductor device of various example embodiments may constitute or correspond to a high voltage transistor that constitutes or is included in a peripheral circuit of a flash memory device and an electrically erasable and programmable read only memory (EEPROM) device, which is a nonvolatile memory device operating at a high voltage. Alternatively or additionally, various example embodiments may constitute or correspond to a transistor included in an IC chip for a liquid crystal display (LCD), an IC chip used in an LED display device, or a micro LED display device, and the like.

Figure 22:
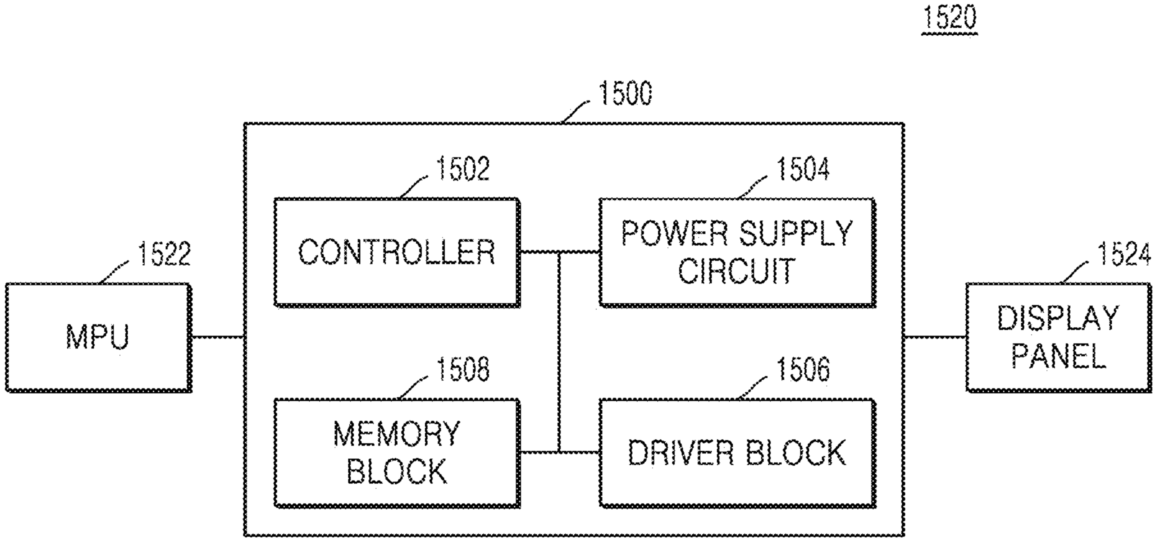
FIG. 22 is a schematic block diagram of a display driver IC (DDI) including a semiconductor device and a display device including the DDI according to various example embodiments.

FIG. 22 is a schematic block diagram of a display driver IC (DDI) 1500 and a display device 1520 including the DDI 1500 according to various example embodiments.

Referring to FIG. 22, the DDI 1500 may include a controller 1502, a power supply circuit 1504, a driver block 1506, and a memory block 1508. The controller 1502 receives and decodes a command applied from a main processing unit 1522, and controls each block of the DDI (1500) to implement an operation according to the command. The power supply circuit unit 1504 generates a driving voltage in response to the control of the controller 1502. The driver block 1506 drives a display panel 1524 using the driving voltage generated by the power supply circuit 1504 in response to the control of the control unit 1502. The display panel 1524 may be or may include a liquid crystal display panel and/or a micro LED device. The memory block 1508 is a block that temporarily stores a command input to the controller 1502 and/or control signals output from the controller 502 or stores necessary data, and may include a memory such as RAM and/or ROM. The power supply circuit unit 1504 and the driver block 1506 may include one or more semiconductor devices according to various example embodiments described above with reference to FIGS. 1 to 21.

Figure 23:
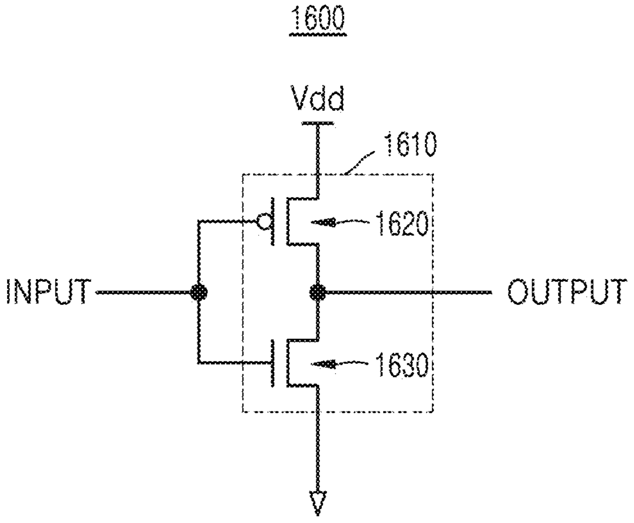
FIG. 23 is a circuit diagram of a CMOS inverter including a semiconductor device according to various example embodiments.

FIG. 23 is a circuit diagram of a CMOS inverter according to various example embodiments.

The CMOS inverter 1600 includes a CMOS transistor 1610. The CMOS transistor 1610 includes a PMOS transistor 1620 and an NMOS transistor 1630 connected between a power terminal Vdd and a ground terminal. The CMOS transistor 1610 may include a semiconductor device according to various example embodiments described above with reference to FIGS. 1 to 21.

Figure 24:
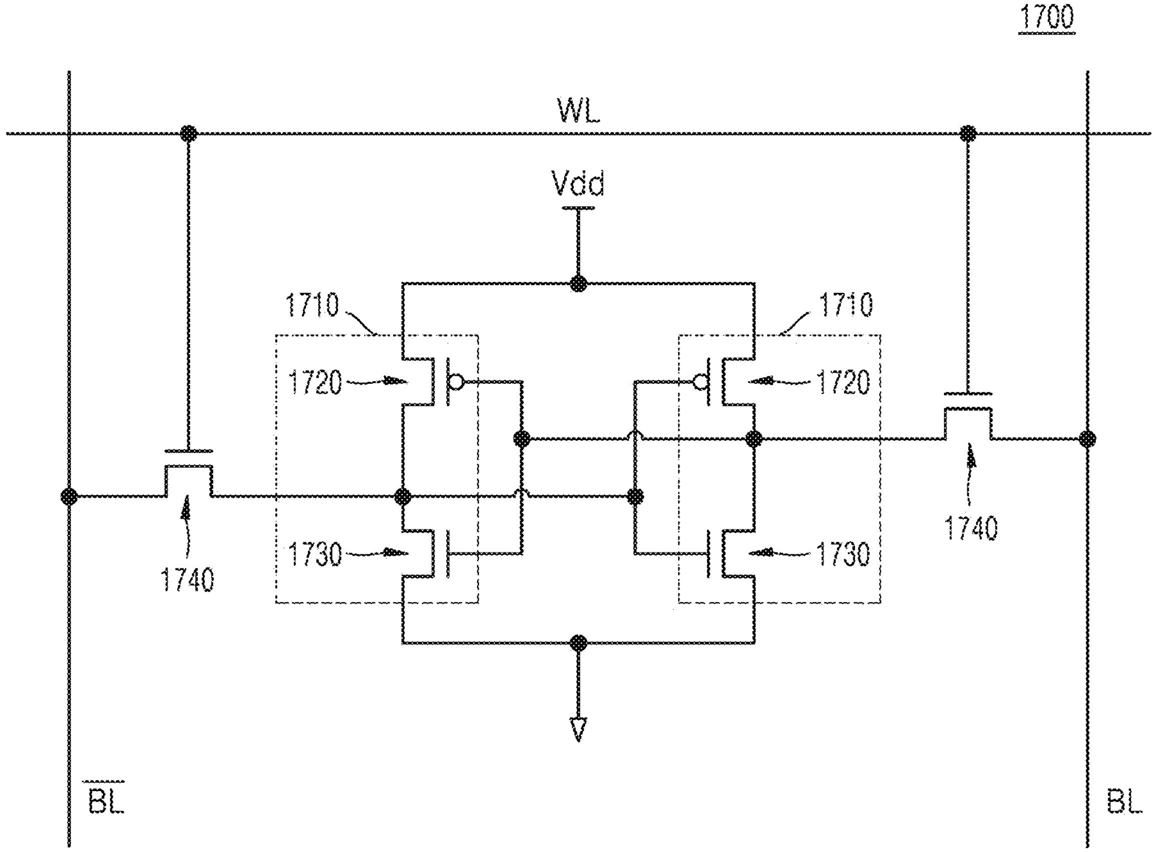
FIG. 24 is a circuit diagram of a CMOS SRAM device including a semiconductor device according to various example embodiments.

FIG. 24 is a circuit diagram of a CMOS SRAM device 1700 according to various example embodiments.

The CMOS SRAM element 1700 includes a pair of driving transistors 1710. The pair of driving transistors 1710 include a PMOS transistor 1720 and an NMOS transistor 1730 connected between a power terminal Vdd and a ground terminal, respectively. The CMOS SRAM element 1700 may further include a pair of transmission transistors 1740. A source of each of the transmission transistors 1740 is cross-connected to a common node of the PMOS transistor 1720 and the NMOS transistor 1730 constituting each of the driving transistors 1710. A power terminal Vdd is connected to a source of the PMOS transistor 1720, and a ground terminal is connected to a source of the NMOS transistor 1730. A word line WL may be connected to a gate of each of a pair of transmission transistors 1740, and a bit line BL and an inverted bit line may be connected to drains of the pair of transmission transistors 740, respectively.

At least one of the driving transistor 1710 and the transmission transistor 1740 of the CMOS SRAM device 1700 may include a semiconductor device according to various example embodiments described above with reference to FIGS. 1 to 21.

Figure 25:
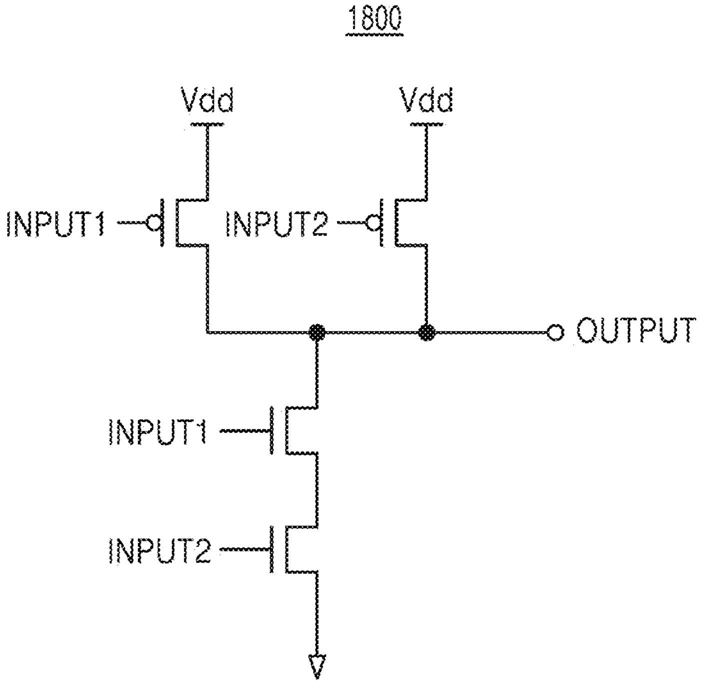
FIG. 25 is a circuit diagram of a CMOS NAND circuit including a semiconductor device according to various example embodiments.

FIG. 25 is a circuit diagram of a CMOS NAND circuit 1800 according to various example embodiments.

The CMOS NAND circuit 1800 includes a pair of CMOS transistors to which different input signals are transmitted. The CMOS NAND circuit 1800 may include a semiconductor device according to various example embodiments described above with reference to FIGS. 1 to 27.

Figure 26:
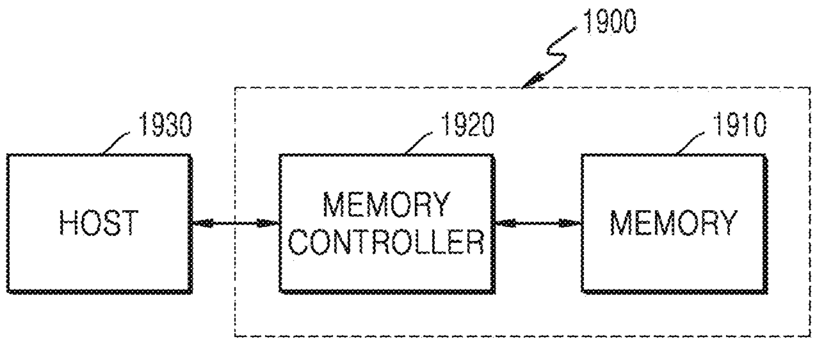
FIG. 26 is a block diagram of an electronic system including a semiconductor device according to various example embodiments.

FIG. 26 is a block diagram illustrating an electronic system 1900 according to various example embodiments.

The electronic system 1900 includes a memory 1910 and a memory controller 1920. The memory controller 1920 may control the memory 1910 to read data from the memory 1910 and/or write data to the memory 1910, in response to a request from the host 1930. At least one of the memory 1910 and the memory controller 1920 may include a semiconductor device according to various example embodiments described above with reference to FIGS. 1 to 21.

Figure 27:
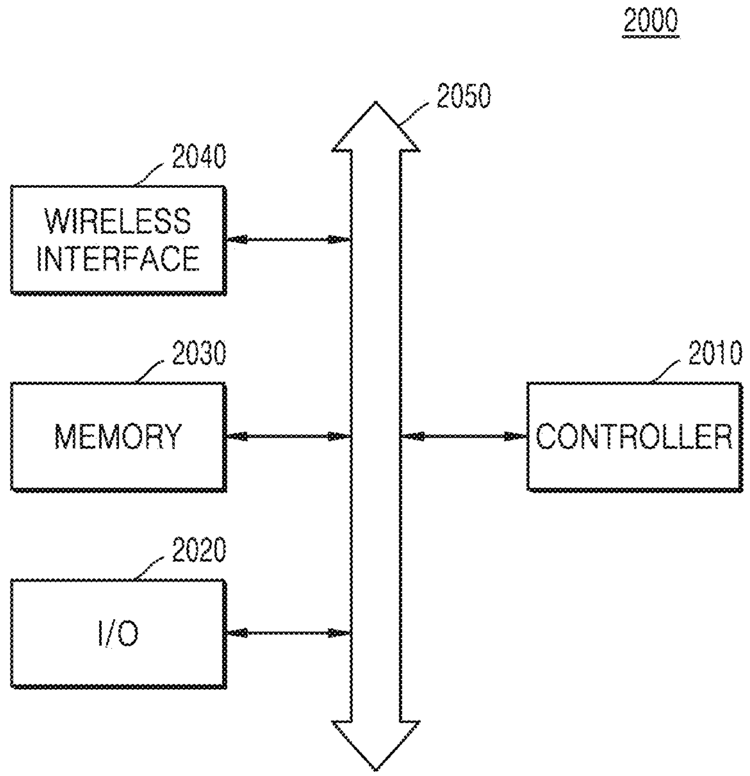
FIG. 27 is a block diagram of an electronic system including a semiconductor device according to various example embodiments.

FIG. 27 is a block diagram of an electronic system 2000 according to various example embodiments.

The electronic system 2000 may configure a wireless communication device or a device capable of transmitting and/or receiving information under a wireless environment. The electronic system 2000 includes a controller 2010, an input/output device (I/O) 2020, a memory 2030, and a wireless interface 2040, which are interconnected through a bus 2050.

The controller 2010 may include at least one of a microprocessor, a digital signal processor, or a processing device similar thereto. The input/output device 2020 may include at least one of a keypad, a keyboard, and a display. The memory 2030 may be used to store a command executed by the controller 2010. For example, the memory 2030 may be used to store user data. The electronic system 2000 may use the wireless interface 2040 to transmit/receive data through a wireless communication network. The wireless interface 2040 may include an antenna and/or a wireless transceiver. The electronic system 1000 may include a semiconductor device according to various example embodiments described above with reference to FIGS. 1 to 27.

The semiconductor device and/or a manufacturing method thereof according to various example embodiments may suppress a side reaction and an interface composition separation phenomenon induced during semiconductor deposition. In addition, improved contact characteristics may be provided, and ion degradation may be prevented or reduced in likelihood of occurrence.

The semiconductor device according to various example embodiments includes a buffer including a silicide material between an electrode and an oxide channel, thereby reducing or suppressing side reactions and/or interface composition separation induced during deposition of oxide semiconductor and providing improved contact properties. In the method of manufacturing a semiconductor device according to various example embodiments, a buffer including a silicide material may be formed between an electrode and an oxide channel.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that various example embodiments described herein should be considered in a descriptive sense only and not for purposes of limitation. Descriptions of features or aspects within each embodiment should typically be considered as available for other similar features or aspects in other embodiments. Example embodiments are not necessarily mutually exclusive with one another. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a substrate;
a lower electrode on the substrate;
a metal oxide on the lower electrode;
a first buffer on the metal oxide;
an oxide channel on the first buffer;
a gate insulating layer contacting the oxide channel;
a gate electrode contacting the gate insulating layer; and
an upper electrode on the oxide channel, wherein
the first buffer is between the metal oxide and the oxide channel, the first buffer includes a silicide material, the upper electrode and the lower electrode are spaced apart from each other in a perpendicular direction that is perpendicular to the substrate, and a longitudinal direction of the oxide channel is perpendicular to the substrate.

2. The semiconductor device of claim 1, wherein the silicide material comprises at least one of $WSi_x$ (tungsten silicide), $RuSi_x$ (ruthenium silicide), $NiSi_x$ (nickel silicide), and $TiSi_x$ (titanium silicide).

3. The semiconductor device of claim 1, wherein the first buffer has a thickness of about 1 Angstrom or more and about 50 Angstroms or less.

4. The semiconductor device of claim 1, further comprising:
a second buffer between the upper electrode and the oxide channel and including a silicide material.

5. The semiconductor device of claim 1, further comprising:
a second buffer between the upper electrode and the oxide channel and including at least one of molybdenum (Mo), gold (Au), platinum (Pt), rhodium (Rh), ruthenium (Ru), titanium (Ti), tantalum (Ta), and iridium (Ir).

6. The semiconductor device of claim 1, wherein the first buffer directly contacts both the metal oxide and the oxide channel.

7. The semiconductor device of claim 1, wherein the gate electrode surrounds a perimeter of the oxide channel.

8. The semiconductor device of claim 1, wherein the oxide channel comprises at least one of indium (In), zinc (Zn), tin (Sn), gallium (Ga), and hafnium (Hf).

9. The semiconductor device of claim 1, wherein the oxide channel comprises In and Zn, and an atomic percent of In in a metal contact part of the oxide channel is greater than or equal to an atomic percent of Zn in the metal contact part of the oxide channel.

10. The semiconductor device of claim 1, wherein the oxide channel comprises a material selected from InGaZnO, ZnO, ZrInZnO, InZnO, $InGaZnO_4$, ZnSnO, ZnInO, $In_2O_3$, $Ga_2O_3$, HfInZnO, GaInZnO, $HfO_2$, $SnO_2$, $WO_3$, $TiO_2$, $Ta_2O_5$, $In_2O_3SnO_2$, MgZnO, $ZnSnO_3$, $ZnSnO_4$, CdZnO, $CuAlO_2$, $CuGaO_2$, $Nb_2O_5$, $TiSrO_3$, zinc indium oxide (ZIO), indium gallium oxide (IGO), and a combination thereof.

11. The semiconductor device of claim 1, wherein the lower electrode comprises at least one of tungsten (W), cobalt (Co), nickel (Ni), iron (Fe), titanium (Ti), molybdenum (Mo), chromium (Cr), zirconium (Zr), hafnium (Hf), niobium (Nb), tantalum (Ta), silver (Ag), gold (Au), aluminum (Al), copper (Cu), antimony (Sb), vanadium (V), ruthenium (Ru), platinum (Pt), zinc (Zn), and magnesium (Mg).

12. The semiconductor device of claim 1, wherein the longitudinal direction of each of the oxide channel, the gate insulating layer, and the gate electrode are perpendicular to the substrate.

13. The semiconductor device of claim 1, wherein the oxide channel has a U-shaped cross-section.

14. The semiconductor device of claim 1, wherein
the oxide channel comprises a first oxide channel having an L shape in which the longitudinal direction of the oxide channel is perpendicular to the substrate, and a second oxide channel symmetrically arranged with respect to the first oxide channel in the perpendicular direction, and
the gate electrode comprises a first gate electrode having a longitudinal direction perpendicular to the substrate and a second gate electrode symmetrically arranged with respect to the first gate electrode in the perpendicular direction.

15. The semiconductor device of claim 1, wherein the lower electrode, the first buffer, and the oxide channel have a same width.

* * * * *